(12) United States Patent
Kim et al.

(10) Patent No.: US 10,083,978 B2
(45) Date of Patent: Sep. 25, 2018

(54) SEMICONDUCTOR DEVICE AND METHOD OF MANUFACTURING THE SAME

(71) Applicant: Samsung Electronics Co., Ltd., Suwon-si (KR)

(72) Inventors: Dong-Won Kim, Hwaseong-si (KR); Bong-Tae Park, Seoul (KR); Ho-Jun Seong, Suwon-si (KR); Jae-Hwang Sim, Hwaseong-si (KR); Jung-Hoon Jun, Incheon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/867,974

(22) Filed: Jan. 11, 2018

(65) Prior Publication Data

US 2018/0138188 A1    May 17, 2018

Related U.S. Application Data

(62) Division of application No. 15/472,720, filed on Mar. 29, 2017, now Pat. No. 9,905,569.

(30) Foreign Application Priority Data

Aug. 24, 2016  (KR) .................. 10-2016-0107708

(51) Int. Cl.

| H01L 29/788 | (2006.01) |
|---|---|
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 27/1157 | (2017.01) |
| H01L 27/11534 | (2017.01) |
| H01L 27/11524 | (2017.01) |

(Continued)

(52) U.S. Cl.
CPC ...... *H01L 27/1157* (2013.01); *H01L 21/0273* (2013.01); *H01L 21/26513* (2013.01); *H01L 21/28088* (2013.01); *H01L 21/28273* (2013.01); *H01L 21/28282* (2013.01); *H01L 21/31111* (2013.01); *H01L 21/31144* (2013.01); *H01L 21/32133* (2013.01); *H01L 21/823418* (2013.01); *H01L 21/823456* (2013.01); *H01L 21/823468* (2013.01);
(Continued)

(58) Field of Classification Search
CPC ............ H01L 21/0273; H01L 23/3128; H01L 23/49827; H01L 27/1157
USPC .................................................. 257/316, 365
See application file for complete search history.

(56) References Cited

U.S. PATENT DOCUMENTS

| 6,818,504 B2 | 11/2004 | Rabkin et al. |
| 6,864,546 B2 | 3/2005 | Terauchi et al. |

(Continued)

FOREIGN PATENT DOCUMENTS

| KR | 1020030000194 | 1/2003 |
| KR | 1020060096547 | 9/2006 |

(Continued)

*Primary Examiner* — David S Blum
(74) *Attorney, Agent, or Firm* — Onello & Mello, LLP.

(57) ABSTRACT

A method of forming a nonvolatile memory device includes forming first, second, and third gate structures, with the second and third gate structures including first and second spacer structures formed on a sidewall of the second gate structure and sidewalls of the third gate structure. Impurity regions are formed through ion implantation and the first spacer structure shields the second and third gate structures during ion implantation. The second spacer structure defines resulting impurity regions.

18 Claims, 26 Drawing Sheets

(51) Int. Cl.
  *H01L 21/8234*  (2006.01)
  *H01L 29/49*    (2006.01)
  *H01L 21/28*    (2006.01)
  *H01L 27/11573* (2017.01)
  *H01L 21/311*   (2006.01)
  *H01L 21/027*   (2006.01)
  *H01L 21/265*   (2006.01)
  *H01L 21/3213*  (2006.01)

(52) U.S. Cl.
  CPC .. *H01L 27/11524* (2013.01); *H01L 27/11534* (2013.01); *H01L 27/11573* (2013.01); *H01L 29/4966* (2013.01)

(56) References Cited

U.S. PATENT DOCUMENTS

| | | | |
|---|---|---|---|
| 7,535,036 | B2 | 5/2009 | Watanobe et al. |
| 8,043,922 | B2 | 10/2011 | Lee et al. |
| 8,236,679 | B2 | 8/2012 | Sakamoto et al. |
| 8,372,719 | B2 | 2/2013 | Wang et al. |
| 8,598,644 | B2 | 12/2013 | Sakamoto |
| 2003/0032239 | A1 | 2/2003 | Rabkin et al. |
| 2004/0211981 | A1 | 10/2004 | Terauchi et al. |
| 2006/0220103 | A1 | 10/2006 | Watanobe et al. |
| 2007/0296041 | A1 | 12/2007 | Tamon et al. |
| 2009/0053885 | A1 | 2/2009 | Sakamoto et al. |
| 2010/0197103 | A1 | 8/2010 | Lee et al. |
| 2011/0223753 | A1 | 9/2011 | Wang et al. |
| 2013/0207175 | A1 | 8/2013 | Sakamoto |
| 2016/0013128 | A1 | 1/2016 | Aoyama et al. |
| 2017/0103948 | A1* | 4/2017 | Lee ............ H01L 23/535 |
| 2017/0271513 | A1 | 9/2017 | Yamaguchi |

FOREIGN PATENT DOCUMENTS

| | | |
|---|---|---|
| KR | 1020070018223 | 2/2007 |
| KR | 1020080000775 | 1/2008 |
| KR | 1020100059543 | 6/2010 |
| KR | 1020100088350 | 8/2010 |

* cited by examiner

SEMICONDUCTOR DEVICE AND METHOD OF MANUFACTURING THE SAME

CROSS-REFERENCE TO RELATED APPLICATION

This application is a divisional application of U.S. patent application Ser. No. 15/472,720, issued as U.S. Pat. No. 9,905,569, filed Mar. 29, 2017, which claims priority under 35 USC § 119 to Korean Patent Application No. 10-2016-0107708, filed on Aug. 24, 2016 in the Korean Intellectual Property Office (KIPO), the contents of which are herein incorporated by reference in their entirety.

BACKGROUND

1. Field

Example embodiments relate to a semiconductor device and a method of manufacturing the same. More particularly, example embodiments relate to a non-volatile memory device and a method of manufacturing the same.

2. Description of the Related Art

A semiconductor device may include a plurality of gate structures having various line widths. Forming the gate structures having the various line widths on a substrate is may be difficult and, additionally, the gate structures may be damaged due to subsequent processes.

SUMMARY

Example embodiments provide a semiconductor device having improved characteristics.

Example embodiments provide a method of manufacturing a semiconductor device having improved characteristics.

According to example embodiments, a semiconductor device may include first gate structures, second gate structures, first capping insulation patterns, first spacer structures and a first impurity region. The first gate structures may be on a substrate, and each of the first gate structures may have a first width. The second gate structures may be on the substrate, and each of the second gate structures may have a second width greater than the first width. The first capping insulation patterns may cover upper portions of the first and second gate structures, and a first opening may be between neighboring ones of the second gate structures. The first spacer structures may be on sidewalls of each of the second gate structures and each of the first capping insulation patterns that are exposed by the first opening. Each of the first spacer structures may include a first spacer and a second spacer. The first impurity region may be at an upper portion of the substrate between the first spacer structures.

According to example embodiments a semiconductor device may include may include first gate structures, second gate structures, a third gate structure, first capping insulation patterns, a second capping insulation pattern, a first spacer structure, a second spacer structure. The first gate structures may be on a first region of a substrate, and each of the first gate structures may have a first width. The second gate structures may be on the first region of the substrate, and each of the second gate structures may have a second width greater than the first width. Sidewalls of neighboring ones of the second gate structures may be opposite to each other. A third gate structure may be on a second region of the substrate. The third gate structure may have a third width greater than the second width. The first capping insulation patterns may cover upper portions of the first and second gate structures, a first opening may be between neighboring ones of the second gate structures. The second capping insulation pattern may be on the third gate structure. The first spacer structure may be formed on sidewalls of each of the second gate structures and each of the first capping insulation patterns exposed by the first opening. The first spacer structure may include a first spacer and a second spacer. The second spacer structure may be on sidewalls of the third gate structure and the second capping insulation pattern. The second spacer structure may include a third spacer and a fourth spacer.

According to example embodiments, a method of manufacturing a semiconductor device may include a gate structure layer on a substrate. The gate structure layer may be partially etched to form a plurality of first gate structures on a region of the substrate through a first patterning process. Each of the plurality of first gate structures may have a first width. A capping insulation layer may be formed to cover an upper portion of the plurality of first gate structures and the gate structure layer. The capping insulation layer and the gate structure layer may be partially etched to form a plurality of second gate structures and a plurality of first capping insulation patterns through a second patterning process. Each of the plurality of second gate structures may have a second width greater than the first width, and sidewalls of neighboring ones of the plurality of second gate structures may be opposite to each other. A first spacer structure may be on sidewalls of each of the plurality of second gate structures and each of the plurality of first capping insulations. The first spacer structure may include a first spacer and a second spacer. An impurity region may be at an upper portion of the substrate between the plurality of first gate structures.

According to example embodiments, a method of manufacturing a semiconductor device may include a gate structure layer formed on a first region and a second region of a substrate. The gate structure layer may be partially etched to form a plurality of first gate structures on the first region through a first patterning process. Each of the plurality of first gate structures may have a first width. A capping insulation layer may be formed to cover the plurality of first gate structures and the gate structure layer. The capping insulation layer and the gate structure layer may be partially etched to form a plurality of second gate structures, a first capping insulation pattern covering upper portions of the first and second gate structures, and a third gate structure and a second capping insulation pattern on the second region through a second patterning process. Each of the plurality of second gate structures may have a second width greater than the first width, and sidewalls of neighboring ones of the plurality of second gate structures may be opposite to each other. The third gate structure may have a third width greater than the second width. A first spacer layer may be on surfaces of the second and third gate structures, the first and second capping insulation pattern, and the substrate. A second space layer may be on the first spacer layer. The first and second spacer layers may be anisotropically etched to form a first spacer structure on sidewalls of each of the plurality of second gate structures and each of the plurality of first capping insulation patterns and a second spacer structure on sidewalls of the third gate structure and second capping insulation pattern. The first spacer structure may include a first spacer and a second spacer, and the second spacer including a third spacer and a fourth spacer.

In the semiconductor device in accordance with example embodiments, the spacer structure including the first and second spacers may be on the sidewall of the second gate structure and the both sidewalls of the third gate structures. Thus, the spacer structure may protect the sidewalls of the second and third gate structures.

In example embodiments in accordance with principles of inventive concepts, a method of forming a nonvolatile memory device, such as a NAND memory device, includes forming first, second, and third gate structures, with the second and third gate structures including first and second spacer structures formed on a sidewall of the second gate structure and sidewalls of the third gate structure. Impurity regions are formed through ion implantation and the first spacer structure shields the second and third gate structures during ion implantation. The second spacer structure defines resulting impurity regions. Capping patterns may be formed on the second and third gate structures, with sidewalls of the capping patterns having a stepped shape to form a gap between capping patterns with that is wider at the top and the gap between capping patterns may be filled with an interlayer insulation pattern and a contact plug may be formed through the interlayer insulation pattern. The first gate structure may be that of a cell transistor, the second gate structure may be that of a selection transistor, and the third gate structure may be that of a peripheral transistor.

BRIEF DESCRIPTION OF THE DRAWINGS

Example embodiments will be more clearly understood from the following detailed description taken in conjunction with the accompanying drawings.

FIGS. 1 and 2 are cross-sectional views illustrating a non-volatile memory device in accordance with example embodiments;

FIGS. 3 to 16 are cross-sectional views illustrating stages of a method of manufacturing a non-volatile memory device in accordance with example embodiments;

FIG. 17 is a cross-sectional view illustrating a non-volatile memory device in accordance with example embodiments;

FIG. 18 is a cross-sectional view illustrating a non-volatile memory device in accordance with example embodiments;

FIGS. 19 to 24 are cross-sectional views illustrating stages of a method of manufacturing a non-volatile memory device in accordance with example embodiments;

FIG. 25 is a cross-sectional view illustrating a non-volatile memory device in accordance with example embodiments;

FIG. 26 is a cross-sectional view illustrating a non-volatile memory device in accordance with example embodiments.

DESCRIPTION OF EMBODIMENTS

Figure 1:
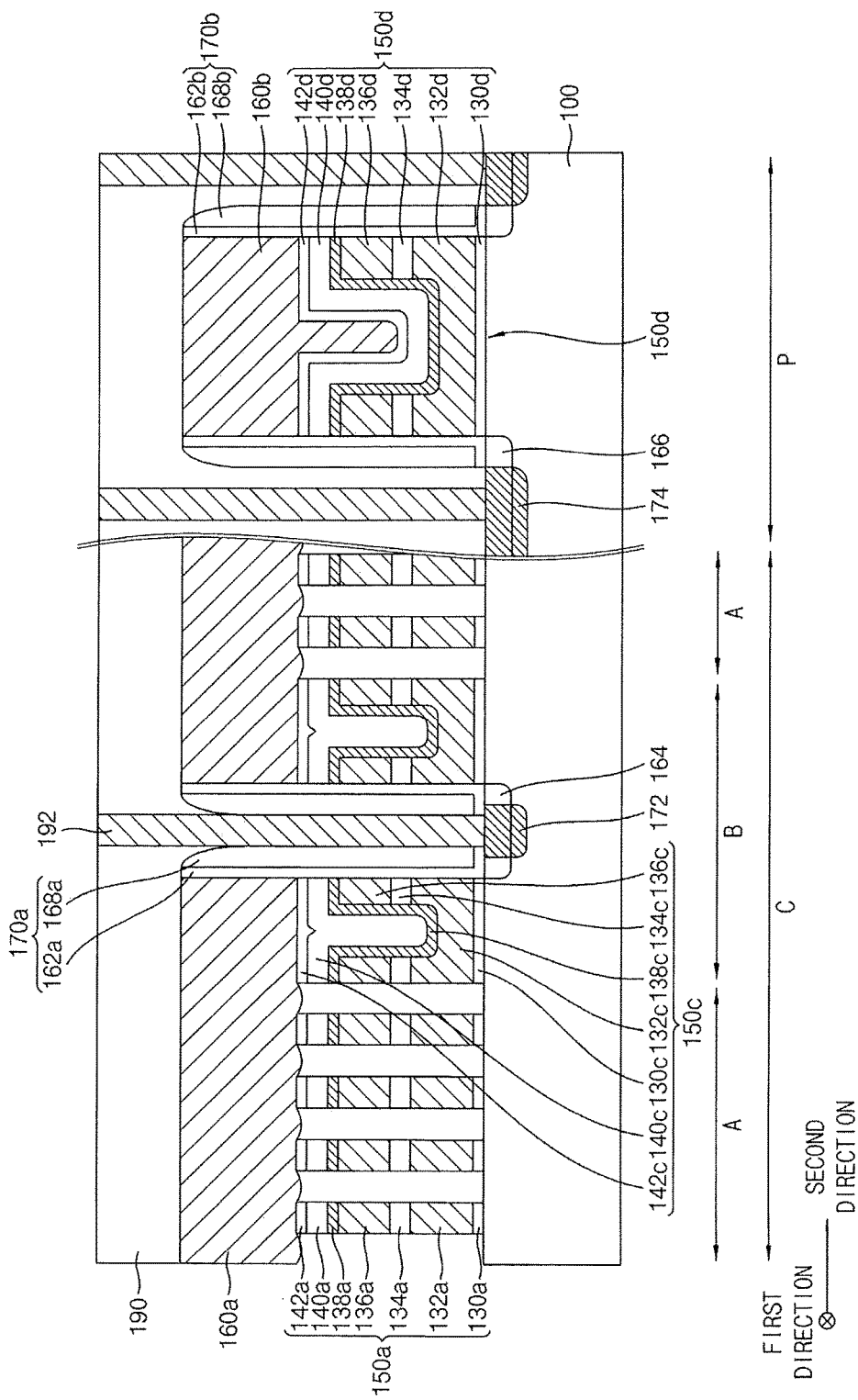
FIGS. 1 to 26 represent non-limiting, example embodiments as described herein.
Figure 2:
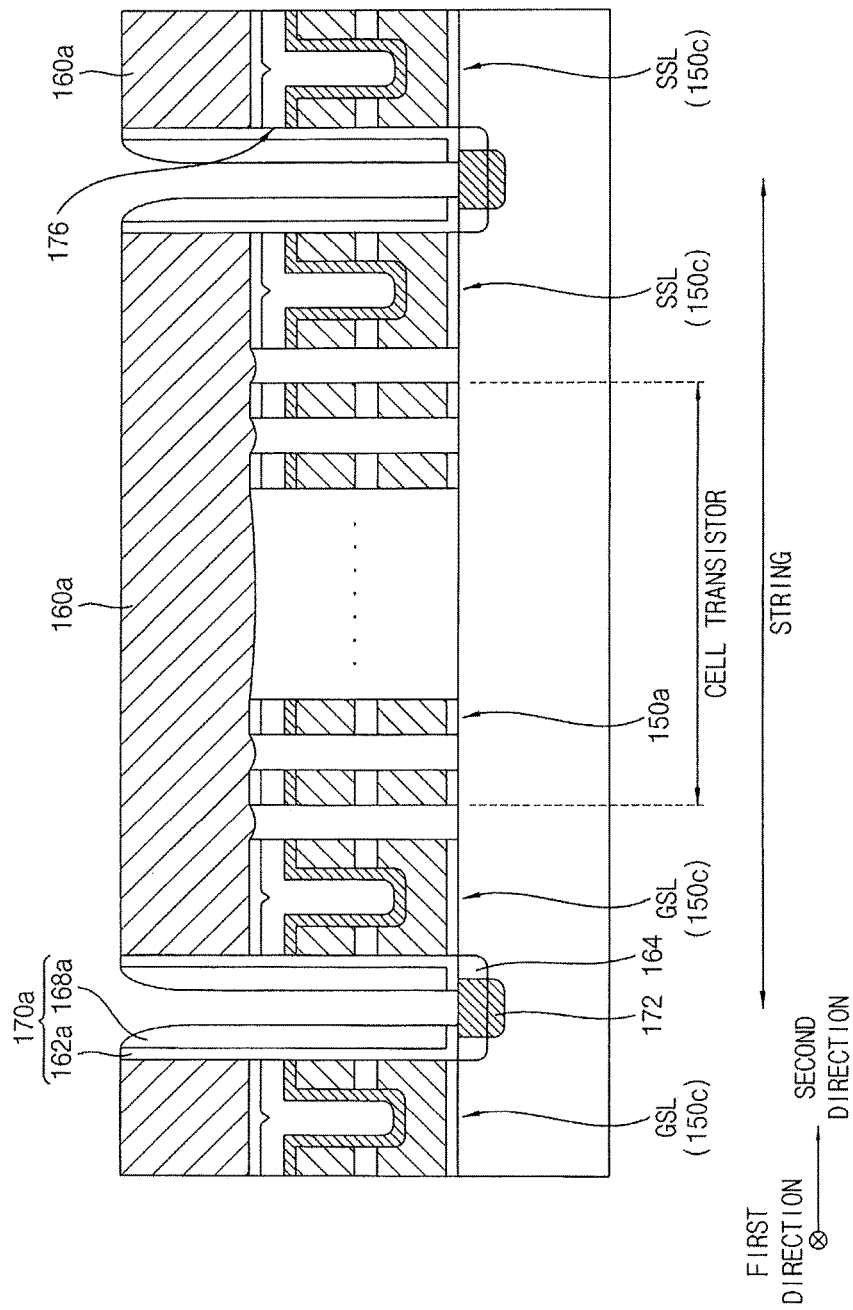

FIGS. 1 and 2 are cross-sectional views illustrating example embodiments of a non-volatile memory device in accordance with principles of inventive concepts.

FIG. 1 shows a plurality of gate structures on a cell region C and a peripheral circuit region P, and FIG. 2 shows a plurality of memory cells on the cell region C.

Referring to FIGS. 1 and 2, a substrate 100 may include the cell region C and the peripheral circuit region P.

The memory cells may be formed on the cell region C. Each of the memory cells may include a cell string including a plurality of cell transistors connected to each other and a plurality of selection transistors connected to end portions of the cell string. In example embodiments, each of the memory cells may include a plurality of cell strings on, or in, the cell region C. Each of the cell strings may include a string selection transistor (SST), cell transistors and a ground selection transistor (GST). The cell region C may include a cell transistor region A for the cell transistors and a selection transistor region B for the selection transistors.

A plurality of peripheral circuit transistors may be formed on the peripheral circuit region P.

The cell transistor may include a first gate structure 150*a*. The first gate structure 150*a* may include a gate insulation layer 130*a*, a first conductive pattern 132*a*, a dielectric pattern 134*a*, a second conductive pattern 136*a*, a third conductive pattern 138*a*, a first mask 140*a* and a second mask 142*a* sequentially stacked.

In the first gate structure 150*a*, the gate insulation layer 130*a* and the first conductive pattern 132*a* may serve as a tunnel insulation layer and a floating gate electrode, respectively.

The first gate structure 150*a* may extend in a first direction ("into" the figure, in this illustration). The first gate structure 150*a* may have a first width in a second direction substantially perpendicular to the first direction (to the right, in this illustration). A plurality of first gate structures 150*a* may be spaced apart from each other, and a gap between the first gate structures 150*a* may have a first distance in the second direction.

The selection transistor may include a second gate structure 150*c*. The second gate structure 150*c* may include a gate insulation layer 130*c*, a first conductive pattern 132*c*, a dielectric pattern 134*c*, a second conductive pattern 136*c*, a third conductive pattern 138*c*, a first mask 140*c* and a second mask 142*c* sequentially stacked.

In the second gate structure 150*c*, a first recess may be formed at an upper central portion of a structure including the first conductive pattern 132*c*, the dielectric pattern 134*c* and the second conductive pattern 136*c* sequentially stacked. In this manner, the third conductive pattern 138*c* may be formed on an inner wall of the first recess and an upper surface of the second conductive pattern 136*c*. The third conductive pattern 138*c* may be electrically connected with the first and second conductive patterns 132*c* and 136*c*. Thus, in example embodiments, a structure including the first, second and third conductive patterns 132*c*, 136*c* and 138*c* may serve as a second gate electrode.

The peripheral circuit transistor may include a third gate structure 150*d*. The third gate structure 150*d* may include a gate insulation layer 130*d*, a first conductive pattern 132*d*, a dielectric pattern 134*d*, a second conductive pattern 136*d*, a third conductive pattern 138*d*, a first mask 140*d* and a second mask 142*d* sequentially stacked.

In the third gate structure 150*d*, a second recess may be formed at an upper central portion of a structure including the first conductive pattern 132*d*, the dielectric pattern 134*d* and the second conductive pattern 136*d* sequentially stacked. Thus, in example embodiments, the third conductive pattern 138*d* may be formed on an inner wall of the second recess and an upper surface of the second conductive pattern 136*d*. The third conductive pattern 138*d* may be electrically connected with the first and second conductive patterns 132*d* and 136*d* and the first, second and third conductive patterns 132*d*, 136*d* and 138*d* may serve as a third gate electrode.

In the first, second and third gate structures 150*a*, 150*c* and 150*d*, the third conductive patterns 138*a*, 138*c* and 138*d* may have resistances lower than resistances of the second conductive patterns 136a, 136c and 136d. Each of the third conductive patterns 138a, 138c and 138d may include, for example, a metal, a metal nitride, a metal silicide, etc.

A first capping insulation pattern 160a may be formed on each of the first and second gate structures 150a and 150c. A second capping pattern 160b may be formed on the third gate structure 150d.

Two second gate structures 150c may be opposite to, or spatially opposing, each other. One of the opposing second gate structures 150c may serve as a selection transistor of a first string, and the other one of the opposing second gate structures 150c may serve as a selection transistor of a second string different from the first string. In example embodiments, the two opposing second gate structures 150c may serve as string selection transistors of the first and second strings, respectively, or as ground selection transistors of the first and second strings, respectively. Alternatively, one of the two opposite second gate structures 150c may serve as a string selection transistor of the first string, and the other one of the two opposite second gate structures 150c may serve as a ground selection transistor of a second string.

The first capping insulation pattern 160a may be formed on the first and second gate structures 150a and 150c in each of the strings. However, the first capping insulation pattern 160a may not be formed at a space between the strings. That is, the first capping insulation pattern 160a may not be formed at a space between the second gate structures 150c and, as a result, a first opening 176 may be formed between the second gate structures 150c. An upper surface of the substrate 100 may be exposed by the first opening 176. And a second sidewall of the second gate structure 150c and a sidewall of the first capping insulation pattern 160a may be exposed by the first opening 176.

The first capping insulation pattern 160a may not fill a gap between a plurality of first gate structures 150a, and may cover an upper portion of the gap between the first gate structures 150a. Thus, in accordance with principles of inventive concepts, an air gap may be formed between the first gate structures 150a.

A first spacer structure 170a may be formed on a sidewall of the first opening 176. That is, the first spacer structure 170a may be formed on the second sidewall of the second gate structure 150c and the sidewall of the first capping insulation pattern 160a.

The first spacer structure 170a may include a first spacer 162a and a second spacer 168a. The first spacer 162a may be formed on the second sidewall of the second gate structure 150c, the sidewalls of the first capping insulation pattern 160a, and the upper surface of the substrate 100 adjacent to the second gate structure 150c. As a result, the first spacer 162a may include a bent, or curved, or angled, portion between the second gate structure 150c and the upper surface of the substrate 100, so that the first spacer 162a may have an 'L' shape. The second spacer 168a may be formed on the first spacer 162a.

A second spacer structure 170b may be formed on sidewalls of the third gate structure 150d and the second capping insulation pattern 160b.

The second spacer structure 170b may include a third spacer 162b and a fourth spacer 168b. The third spacer 162b may be formed on the sidewalls of the third gate structure 150d, the second capping insulation pattern 160b, and the upper surface of the substrate adjacent to the third gate structure 150d. Thus, in example embodiments, the third spacer 162b may include a bent portion between the third gate structure 150d and the upper surface of the substrate 100, so that the third spacer 162b may have an 'L' shape. The fourth spacer 168b may be formed on the third spacer 162b.

In example embodiments, the first spacer 162a may have an insulation material different from an insulation material of the second spacer 168a and the third spacer 162b may have an insulation material different from an insulation material of the fourth spacer 168b.

The first and third spacers 162a and 162b may include substantially the same material, and the second and fourth spacers 168a and 168b may include substantially the same material. For example, the first and third spacers 162a and 162b may include silicon nitride or silicon oxynitride, and the second and fourth spacers 168a and 168b may include silicon oxide.

A first impurity region 164 may be formed at an upper portion of the substrate 100 between the second gate structures 150c. A third impurity region 166 may be formed at an upper portion of the substrate 100 between the third gate structures 150d.

In example embodiments, the first impurity region 164 may serve as an impurity extension region of the selection transistor. The third impurity region 166 may serve as an impurity extension region of the peripheral circuit transistor.

A second impurity region 172 may be formed at an upper portion of the substrate 100 between the first spacer structures 170a and a fourth impurity region 174 may be formed at an upper portion of the substrate 100 between the second spacer structures 170b. The second impurity region 172 may partially overlap the first impurity region 164. The fourth impurity region 174 may partially overlap the third impurity region 166.

In example embodiments, the second impurity region 172 may serve as an impurity region of the selection transistor and the fourth impurity region 174 may serve as an impurity region of the peripheral circuit transistor.

An insulating interlayer 190 may be formed on the substrate 100 and the first and second capping insulation patterns 160a and 160b. A plurality of contact plugs 192 may be formed through the insulating interlayer 190, and may contact the second and fourth impurity regions 172 and 174, respectively.

FIGS. 3 to 16 are cross-sectional views illustrating stages of an example embodiment of a method of manufacturing a non-volatile memory device in accordance with principles of inventive concepts.

Figure 3:
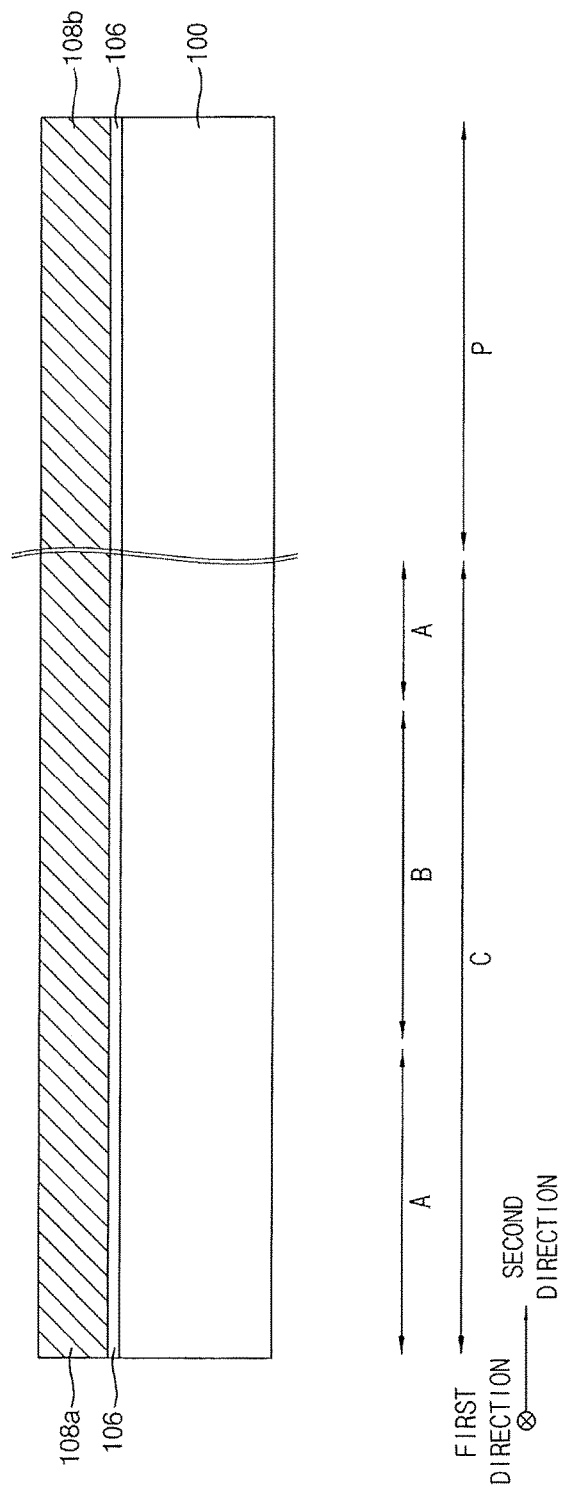
Figure 4:
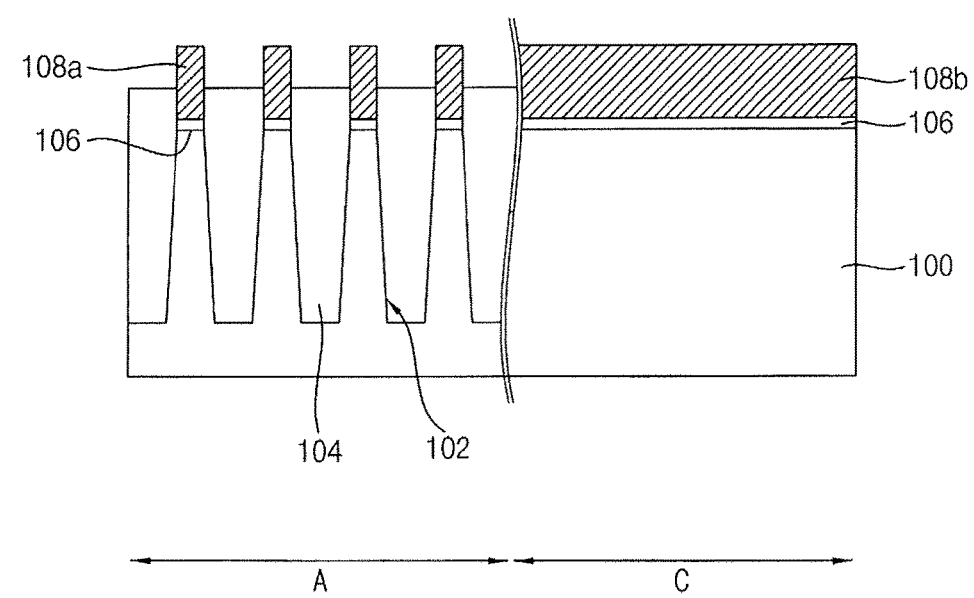

FIGS. 3 and 5 to 16 are cross-sectional views taken along lines extending in the second direction, and FIG. 4 is a cross-sectional view taken along a line extending in the first direction.

Referring to FIGS. 3 and 4, a substrate 100 may include a cell region C and a peripheral circuit region P. The cell region C may include a cell transistor region A for forming the cell transistors and a selection transistor region B for forming the selection transistors.

A preliminary gate insulation layer and a conductive layer may be sequentially formed on the substrate 100. The preliminary gate insulation layer and the conductive layer may be patterned to form a structure including a gate insulation layer 106 and a preliminary first conductive pattern 108a on the cell region of the substrate 100. The substrate 100 may be etched to form a trench 102 for isolation between a plurality of structures. An isolation pattern 104 may be formed to partially, or substantially, fill the trench 102. The trench 102 may extend in the second direction. A plurality of layers on the peripheral circuit region P, such as the preliminary gate insulation layer and the conductive layer, may not be patterned, however, so that the gate insulation layer 106 and the first conductive layer 108b may be formed on the peripheral circuit region P.

The substrate 100 may include a semiconductor material such as, for example, silicon, germanium, silicon-germanium. In example embodiments, the substrate 100 may be a silicon-on-insulator (SOI) substrate or a germanium-on-insulator (GOI) substrate.

The gate insulation layer 106 may be formed of, for example, silicon oxide. The gate insulation layer 106 may be formed, for example, by a thermal oxidation process, a chemical vapor deposition (CVD) process, a high density plasma (HDP)-CVD process, etc.

The preliminary first conductive pattern 108a may serve as a floating gate of a cell transistor subsequently formed or a portion of a gate of a selection transistor subsequently formed. The first conductive layer 108b may serve as a portion of a gate of a peripheral circuit transistor subsequently formed. The preliminary first conductive pattern 108a and the first conductive layer 108b may be formed by the same deposition process, and, as a result, the preliminary first conductive pattern 108a and the first conductive layer 108b may include substantially the same material. For example, the preliminary first conductive pattern 108a and the first conductive layer 108b may include doped polysilicon. In example embodiments, the preliminary first conductive pattern 108a may be formed by depositing a polysilicon layer through a low pressure chemical vapor deposition (LP-CVD) process and patterning the polysilicon layer on the cell region C.

The isolation pattern 104 may include silicon oxide. A portion of the substrate 100 between a plurality of isolation patterns 104 may be defined as an active region.

Hereinafter, the method of manufacturing the non-volatile memory device may be illustrated with reference to cross-sectional views taken along a line extending in the second direction.

Figure 5:
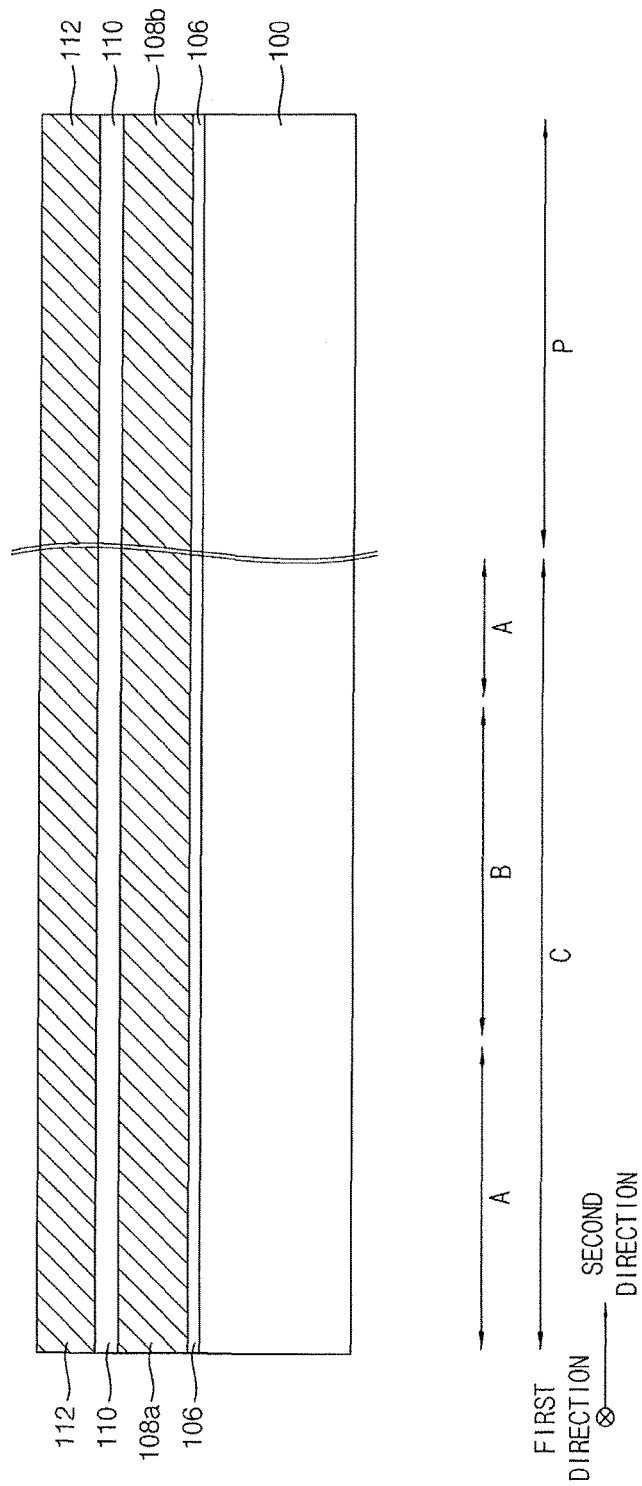

Referring to FIG. 5, a dielectric structure 110 may be formed on the preliminary first conductive pattern 108a, the first conductive layer 108b and the isolation pattern 104. A second conductive layer 112 may be formed on the dielectric structure 110.

In example embodiments, the dielectric structure 110 may include a silicon oxide layer, a silicon nitride layer and a silicon oxide layer sequentially stacked. The silicon oxide layers and the silicon nitride layer may be formed by a CVD process or an atomic layer deposition (ALD) process, for example. Alternatively, the dielectric structure 110 may include a metal oxide having a high dielectric constant, which may be formed of, for example, hafnium oxide, titanium oxide, tantalum oxide, zirconium oxide, aluminum oxide, etc.

The second conductive layer 112 may be formed of, for example, doped polysilicon. In example embodiments, the doped polysilicon may be formed by an LP-CVD process.

Figure 6:
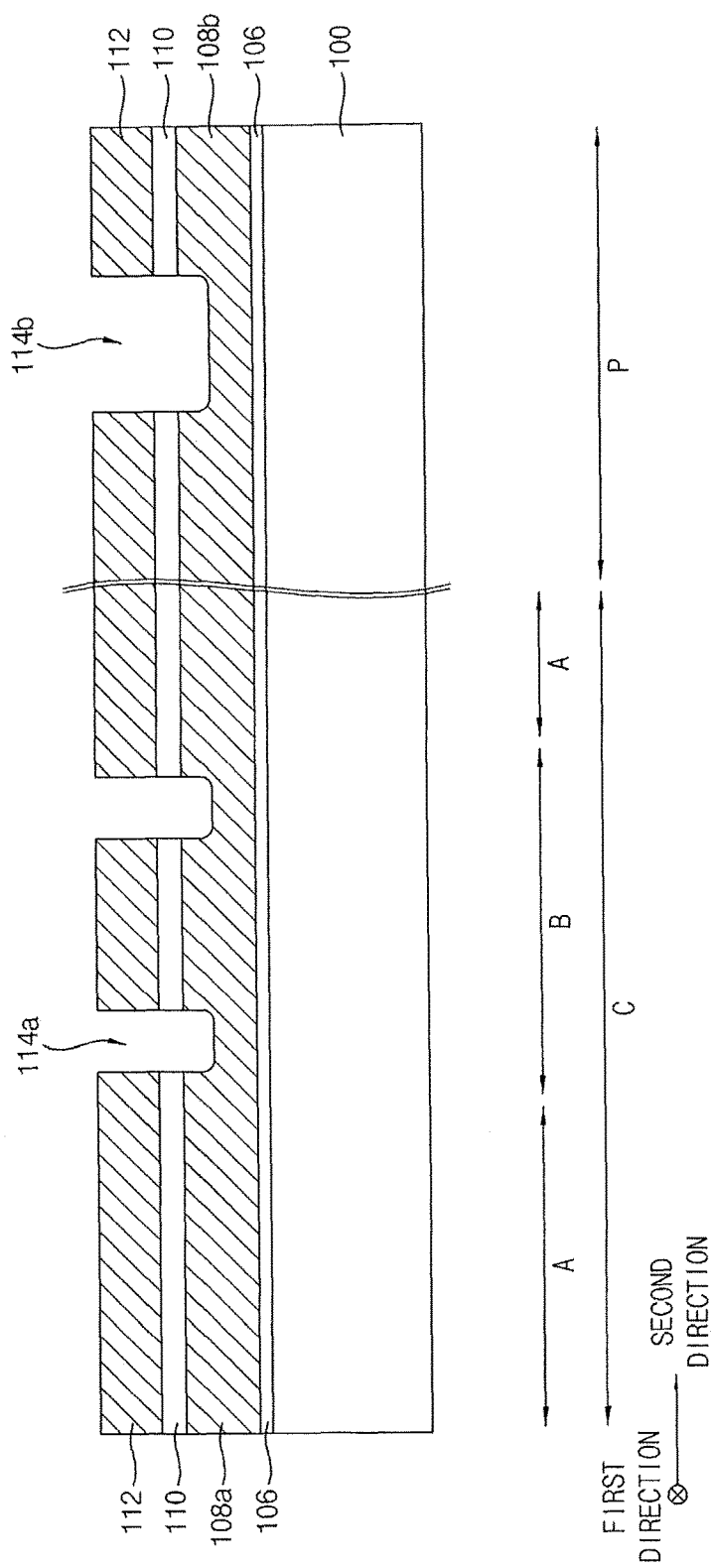

Referring to FIG. 6, the second conductive layer 112 and the dielectric structure 110 on the selection transistor region may be partially etched to form a first recess 114a and the second conductive layer 112 and the dielectric structure 110 on the peripheral circuit region P may be partially etched to form a second recess 114b. The preliminary first conductive pattern 108a and the first conductive layer 108b may be exposed by the first and second recesses 114a and 114b, respectively.

The first recess 114a may extend in the first direction and may be positioned at an upper central portion of a second gate structure 150c (refer to FIG. 10) of the selection transistor subsequently formed.

The second recess 114b may be positioned at an upper central portion of a third gate structure 150d (refer to FIG. 10) of the peripheral circuit transistor subsequently formed. In example embodiments, the second recess 114b may be formed to have a width in the second direction greater than a width in the second direction of the first recess 114a.

Figure 7:
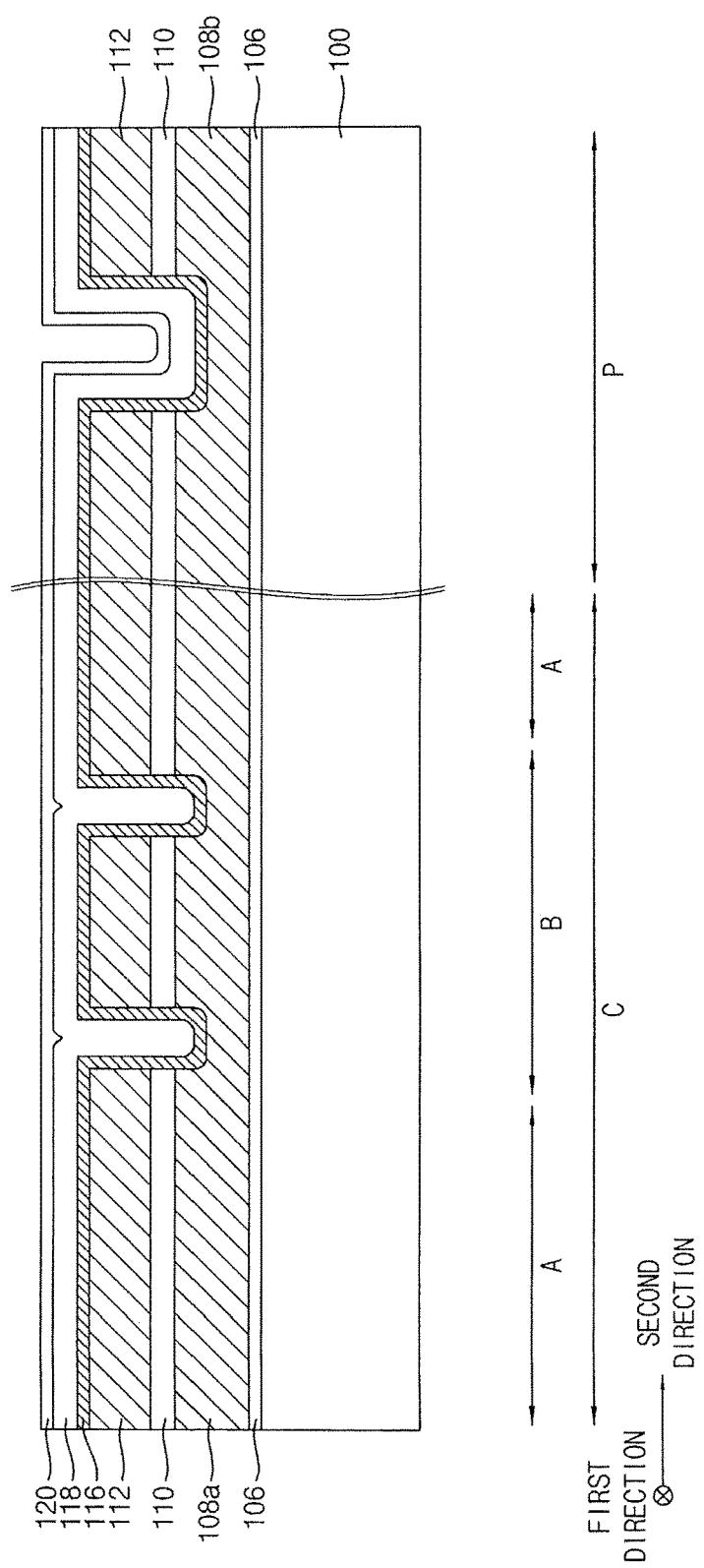

Referring to FIG. 7, a third conductive layer 116 may be conformally formed on an upper surface of the second conductive layer 112 and inner walls of the first and second recesses 114a and 114b. A first mask layer 118 and a second mask layer 120 may be sequentially formed on the third conductive layer 116.

The third conductive layer 116 may be formed of a material having a resistance lower than a resistance of a material of the second conductive layer 112. The third conductive layer 116 may be formed of, for example, a metal, a metal silicide and/or a metal nitride. For example, the third conductive layer 116 may be formed of tungsten. The third conductive layer 116 may be formed by a CVD process or an ALD process. As a result, in example embodiments the preliminary first conductive pattern 108a, the first conductive layer 108b and the second conductive layer 112 may be electrically connected with each other by the third conductive layer 116 on the first and second recesses 114a and 114b.

In example embodiments, the first mask layer 118 may be formed to sufficiently, or substantially, fill the first recess 114a. The first mask layer 118 may be formed to partially fill the second recess 114b. In example embodiments, the first mask layer 118 may be formed of, for example, silicon nitride or silicon oxynitride.

In example embodiments, the second mask layer 120 may be formed of, for example, silicon oxide. The first and second mask layers 118 and 120 may be formed by a CVD process or an ALD process. In some example embodiments, the second mask layer 120 may not be formed.

Figure 8:
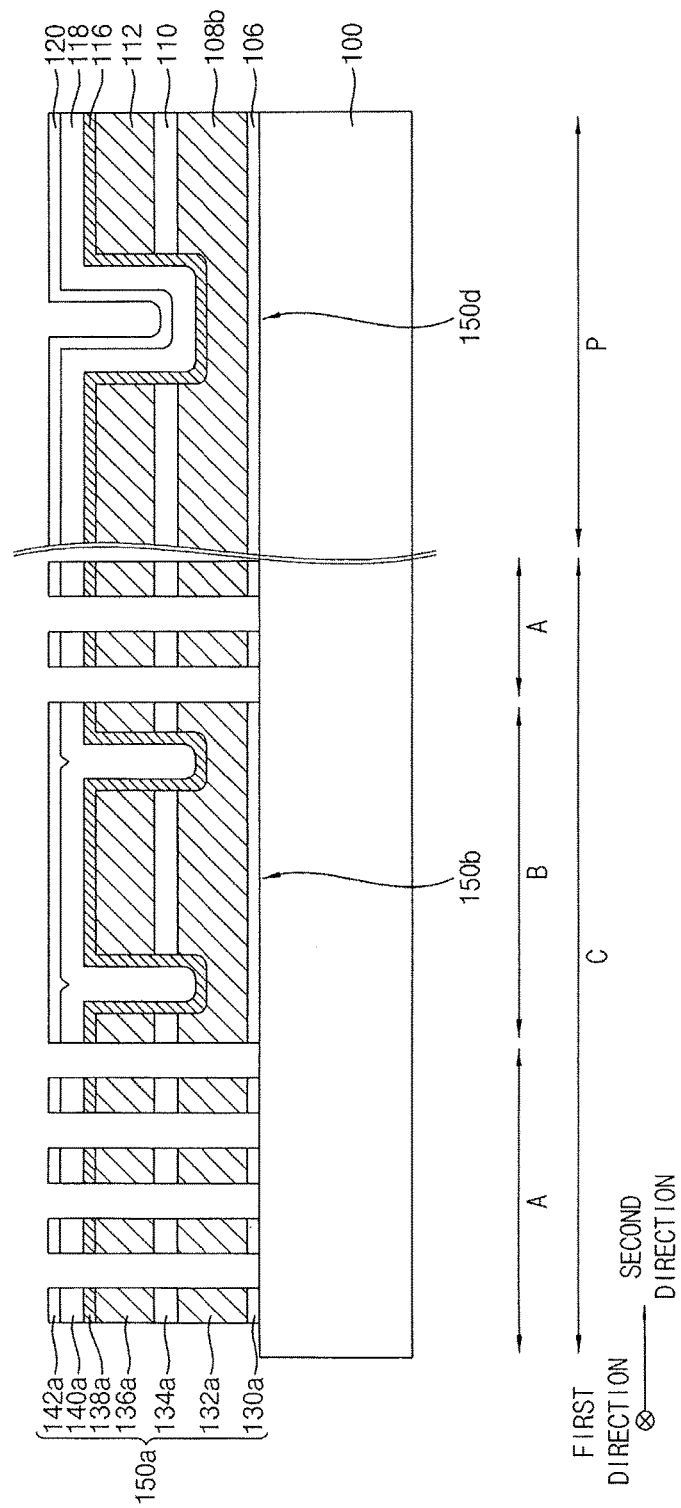

Referring to FIG. 8, the first and second mask layers 118 and 120 on the cell transistor region A may be partially etched to form a first mask 140a and a second mask 142a, respectively. The third conductive layer 116, the second conductive layer 112, the dielectric structure 110, the preliminary first conductive layer 108a and the gate insulation layer 106 may be sequentially etched using the first and second masks 140a and 142a as an etching mask. As a result, a first gate structure 150a including a gate insulation layer 130a, a first conductive pattern 132a, a dielectric pattern 134a, a second conductive pattern 136a, a third conductive pattern 138a, and the first and second masks 140a and 142a sequentially stacked may be formed on the cell transistor region A of the substrate 100.

The first gate structure 150a may serve as a gate electrode of the cell transistor. In the first gate structure 150a, the first conductive pattern 132a may serve as a floating gate pattern and the second and the third conductive patterns 136a and 138a may serve as a control gate pattern. The control gate pattern may include the third conductive pattern 138a, so that a resistance of the control gate pattern may be reduced.

The first gate structure 150a may extend in the first direction. The first gate structure 150a may have a first width in the second direction, and a gap between a plurality of first gate structures 150a may have a first length in the second direction.

A cell string may include the cell transistors electrically connected to each other. At least one of selection transistors may be connected with each of end portions of the cell string. Thus, in example embodiments, the selection transistor region B may be disposed between the cell transistor regions A.

During the etching process, the first and second mask layers 140 and 142, the third conductive layer 116, the second conductive layer 112, the dielectric structure 110, the preliminary first conductive pattern 108a and the gate insulation layer 106 on the selection transistor region B and the peripheral circuit region P may not be etched.

However, in example embodiments, the layers on the cell transistor region A may be patterned so that a preliminary second gate structure 150b extending in the first direction may be formed on the selection transistor region B. Sidewalls of the preliminary second gate structure 150b may serve as a first sidewall of the second gate structure 150c of the selection transistor subsequently formed. That is, the first sidewall of the second gate structure 150c is also formed, during forming the first gate structure 150a, and a second sidewall of the second gate structure 150c may be subsequently formed.

In example embodiments, a liner layer (not shown) may be conformally formed on the first gate structure 150a, the preliminary second gate structure 150b and the second mask layer 120. The liner layer may protect a surface of the first gate structure 150a. The liner layer may be formed of, e.g., silicon oxide, silicon nitride, etc.

Figure 9:
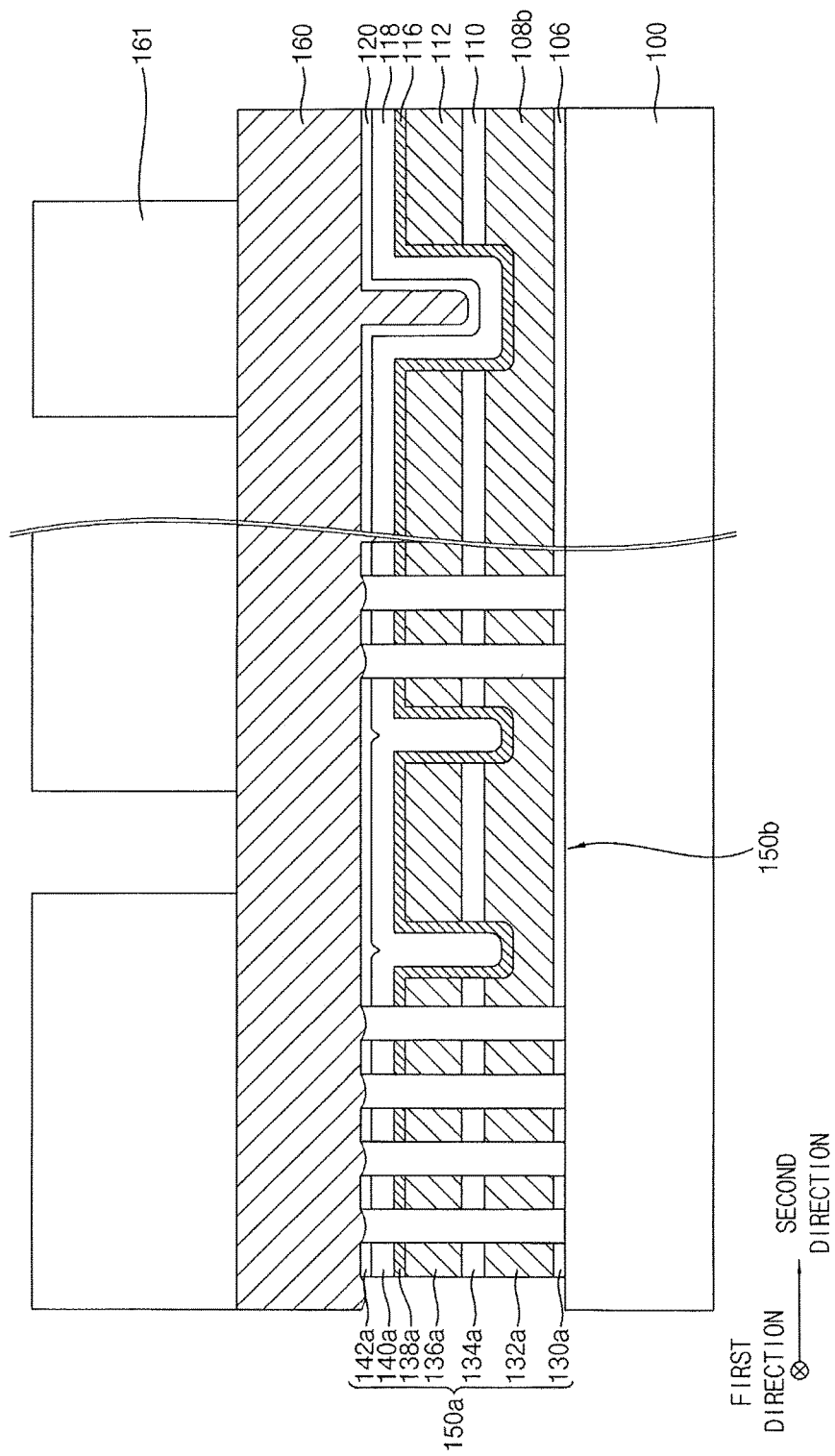

Referring to FIG. 9, a capping insulation layer 160 may be formed on the first gate structure 150a, the preliminary second gate structure 150b and the second mask layer 120. An etching mask 161 may be formed on the capping insulation layer 160.

In example embodiments, the capping insulation layer 160 may not fill a gap between the first gate structures 150a, and may cover an upper portion of the gap between the first gate structures 150a. As a result, in accordance with principles of inventive concepts, an air gap may be formed between the first gate structures 150a.

The capping insulation layer 160 may be formed using a material having a poor step coverage characteristic. In example embodiments, the capping insulation layer 160 may include silicon oxide, e.g., plasma enhanced oxide, middle temperature oxide, etc.

The etching mask 161 may include a photoresist pattern. The etching mask 161 may be used for forming the second and third gate structures 150c and 150d.

In accordance with principles of inventive concepts, the etching mask 161 may completely cover a portion of the capping insulation layer 160 on the cell transistor region A, and may partially cover a portion of the capping insulation layer 160 on a region for forming the second gate structure 150c in the selection transistor region B. The etching mask 161 may expose a portion of the capping insulation layer 160 on a region between the second gate structures 150c, and the exposed portion of the etching mask 161 may extend in the first direction.

The etching mask 161 may partially cover a portion of the capping insulation layer 160 on a region for forming the third gate structure 150d in a peripheral circuit transistor.

Figure 10:
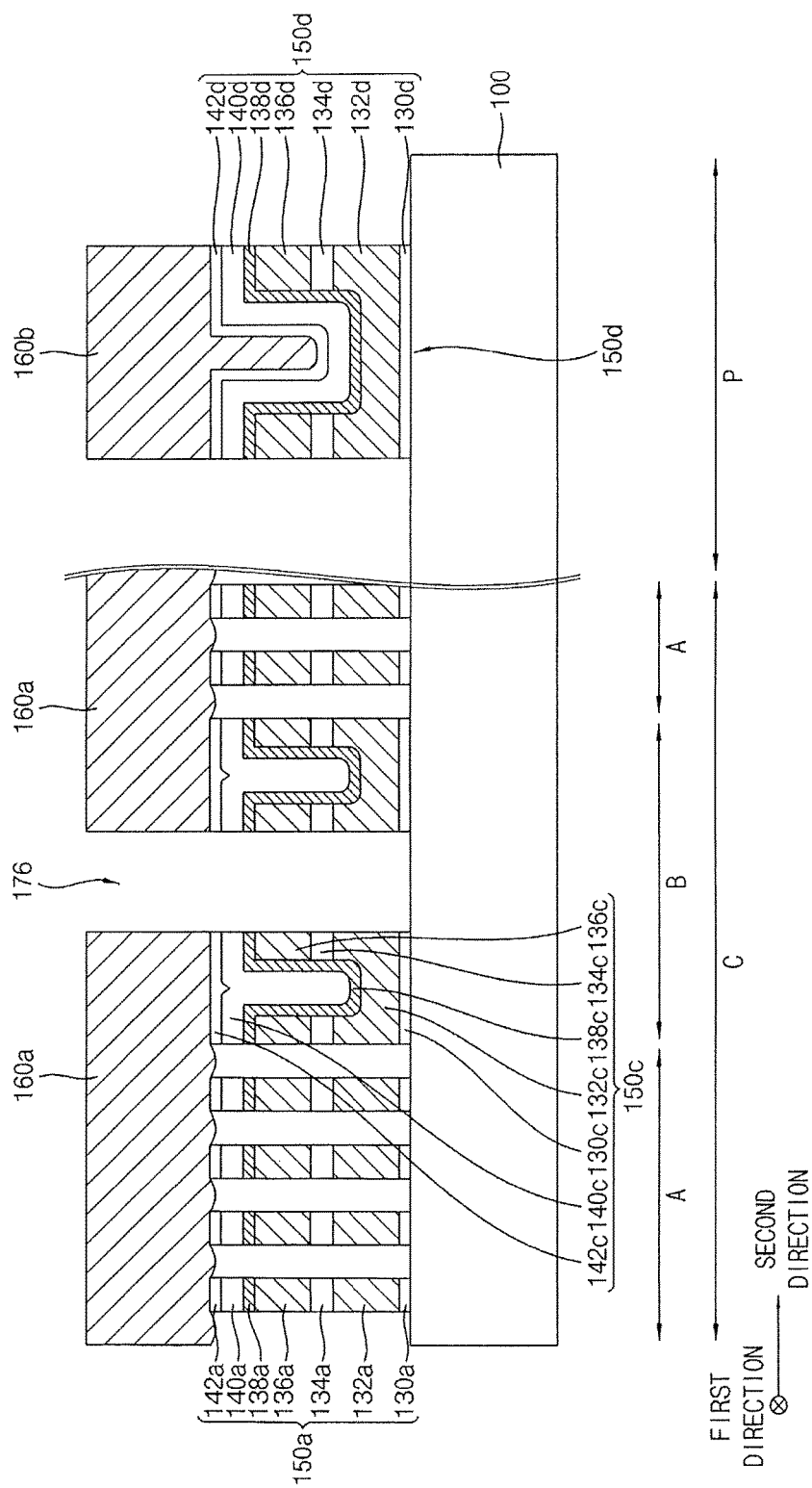

Referring to FIG. 10, the capping insulation layer 160 may be etched using the etching mask 161, and the preliminary second conductive structure 150b and the layers on the peripheral circuit region P may be sequentially etched. That is, the preliminary gate insulation layer 106, the first conductive layer 108b, the dielectric structure 110, the second and third conductive layers 112 and 116, and the first and second mask layers 118 and 120 may be etched.

Thus, in example embodiments, the second gate structure 150c including a gate insulation layer 130c, a first conductive pattern 132c, a dielectric pattern 134c, second and third conductive patterns 136c and 138c, and first and second masks 140c and 142c sequentially stacked may be formed on the selection transistor region B.

Each second gate structure 150c may have a first sidewall opposite the first gate structure 150a and a second sidewall opposite a neighboring one of the second gate structures 150c. The second sidewall of the second gate structure 150c may be formed by etching the preliminary second gate structure 150b. A first capping insulation pattern 160a may be formed on the first and second gate structures 150a and 150c.

The third gate structure 150d, including a gate insulation layer 130d, a first conductive pattern 132d, a dielectric pattern 134d, second and third conductive patterns 136d and 138d, and first and second masks 140d and 142d sequentially stacked, may be formed on the peripheral circuit region P. A second capping insulation pattern 160b may be formed on the third gate structure 150d.

As described above, the second and third gate structures 150c and 150d may have substantially the same stacked structure.

In example embodiments, the third gate structure 150d may have a third width in the second direction greater than a second width in the second direction of the second gate structure 150c.

The second and third gate structures 150c and 150d may include first and second recesses 114a and 114b (refer to FIG. 6), respectively.

In the second gate structure 150c, the first, second and third conductive patterns 132c, 136c and 138c may be electrically connected to each other. As a result, the first, second and third conductive patterns 132c, 136c and 138c may serve as a second gate electrode. In the third gate structure 150d, the first, second and third conductive patterns 132d, 136d and 138d may be electrically connected to each other. As a result, the first, second and third conductive patterns 132d, 136d and 138d may serve as a third gate electrode.

A first opening 176 extending in the first direction may be formed between the second gate structures 150c. The second sidewall of each of the second gate structures 150c may be exposed by the first opening 176. For example, the second gate structure 150c connected to the first cell string may be exposed by a first sidewall of the first opening 176, and the second gate structure 150c connected to the second cell string may be exposed by a second sidewall of the first opening 176. An upper surface of the substrate 100 may be exposed by the first opening 176.

In some example embodiments, each of the sidewalls of the first opening 176 may have a slope and the first and second sidewalls of the second gate structure 150c may have different slopes. For example, a slope of the second sidewall of the second gate structure 150c may be gentler, or more gradual, than a slope of the first sidewall of the second gate structure 150c.

Figure 11:
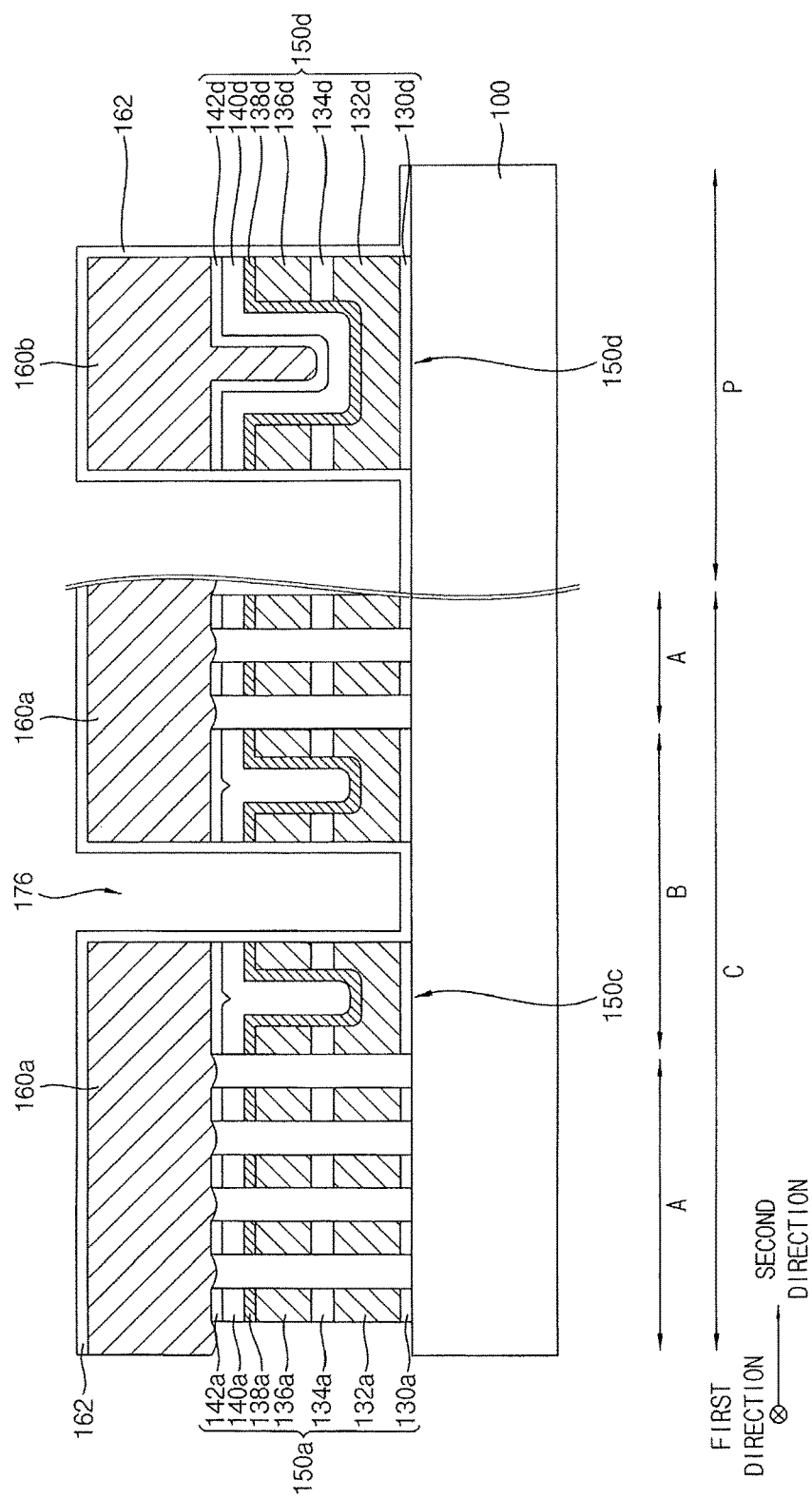

Referring to FIG. 11, a first spacer layer 162 may be conformally formed on the first and second capping insulation patterns 160a and 160b, a sidewall and a bottom of the first opening 176, and surfaces of the substrate 100 and the third gate structure 150d.

The first spacer layer 162 may be formed of, for example, silicon nitride, silicon oxynitride or silicon oxide. The first spacer layer 162 may be formed by a CVD process or an ALD process, for example.

The second sidewall of the second gate structure 150c and sidewalls of the third gate structure 150d may not be exposed by the first spacer layer 162. As a result, in accordance with principles of inventive concepts, during subsequent processes, the first spacer layer 162 may protect the second sidewall of the second gate structure 150c and the sidewalls of the third gate structure 150d. That is, conductive patterns including a metal in the second and third gate structures 150c and 150d may not exposed by the first spacer layer 162, and, as a result, failures of the semiconductor device due to the contamination and/or diffusion of the metal may be reduced.

Figure 12:
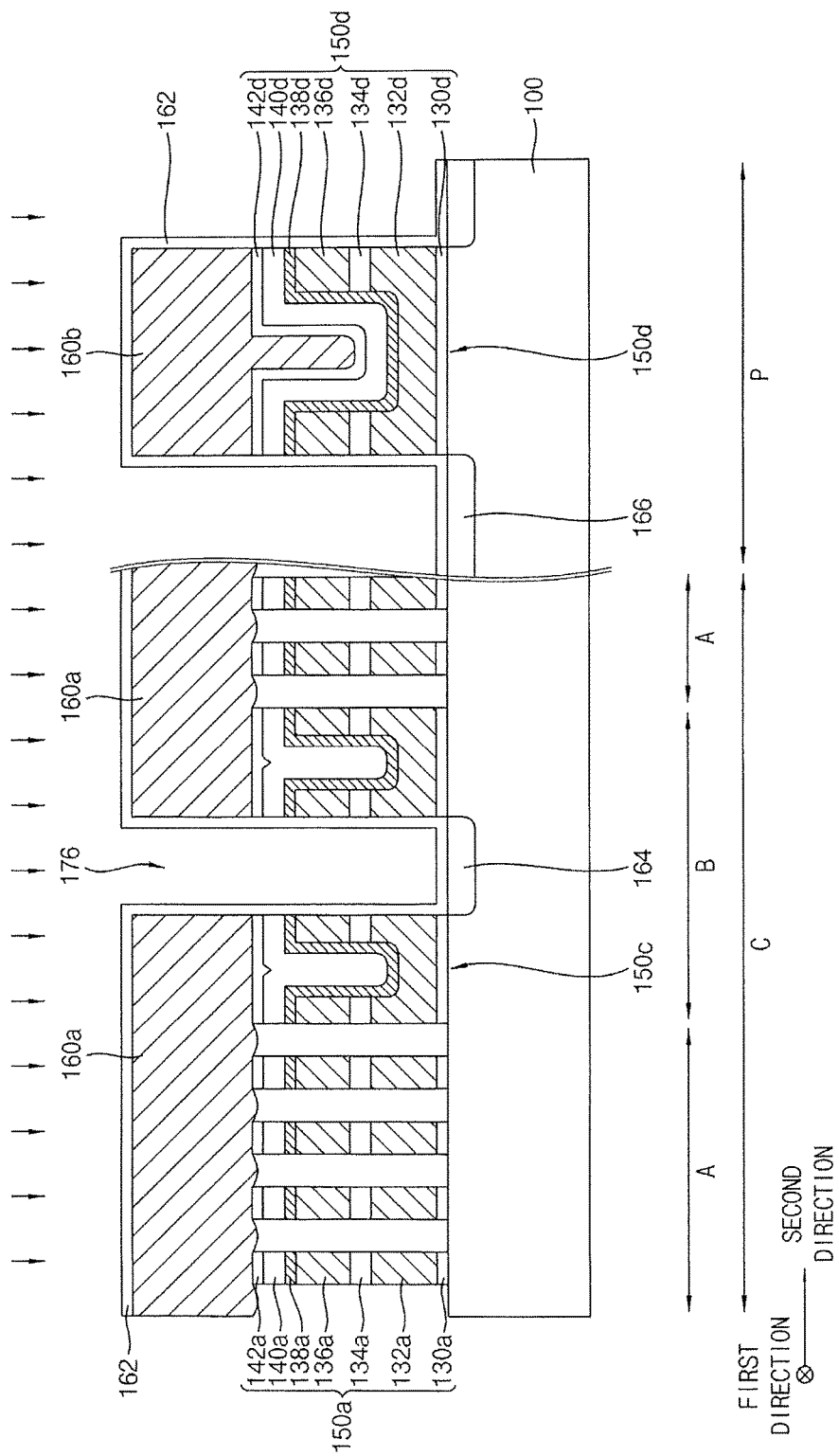

Referring to FIG. 12, impurities may be doped into the substrate 100 through the first spacer layer 162 by an ion implantation process. In this manner, a first impurity region 164 may be formed at an upper portion of the substrate 100 exposed by the first opening 176, and a third impurity region 166 may be formed at an upper portion of the substrate 100 adjacent to the third gate structure 150d. For example, the first impurity region 164 may serve as an impurity extension region of the selection transistor, and the third impurity region 166 may serve as an impurity extension region of the peripheral circuit transistor.

As described above, the ion implantation process may be performed on the first spacer layer 162. Thus, during the ion implantation process, the conductive patterns including a metal in the second and third gate structures 150c and 150d may not be exposed and, as a result, in accordance with principles of inventive concepts, damages of the sidewalls of the second and third gate structures 150c and 150d may be decreased.

Figure 13:
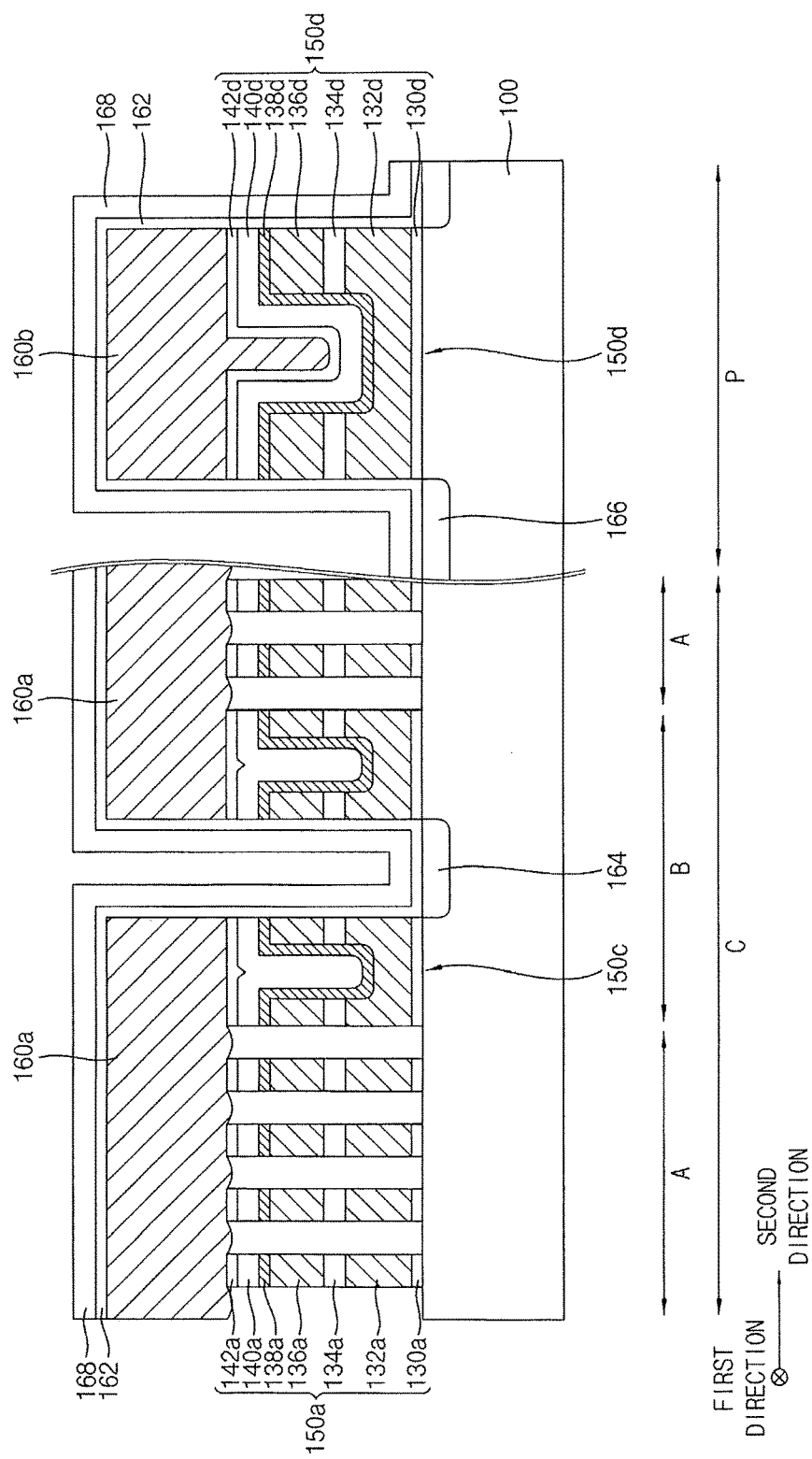

Referring to FIG. 13, a second spacer layer 168 may be formed on the first spacer layer 162.

The second spacer layer 168 may be formed of silicon nitride, silicon oxynitride or silicon oxide and may be formed by a CVD process or an ALD process, for example.

In example embodiments, the second spacer layer 168 may be formed of a material different from a material of the first spacer layer 162. For example, the first spacer layer 162 may include silicon nitride, and the second spacer layer 168 may include silicon oxide.

Alternatively, the second spacer layer 168 may be formed of a material substantially the same as a material of the first spacer layer 162.

Figure 14:
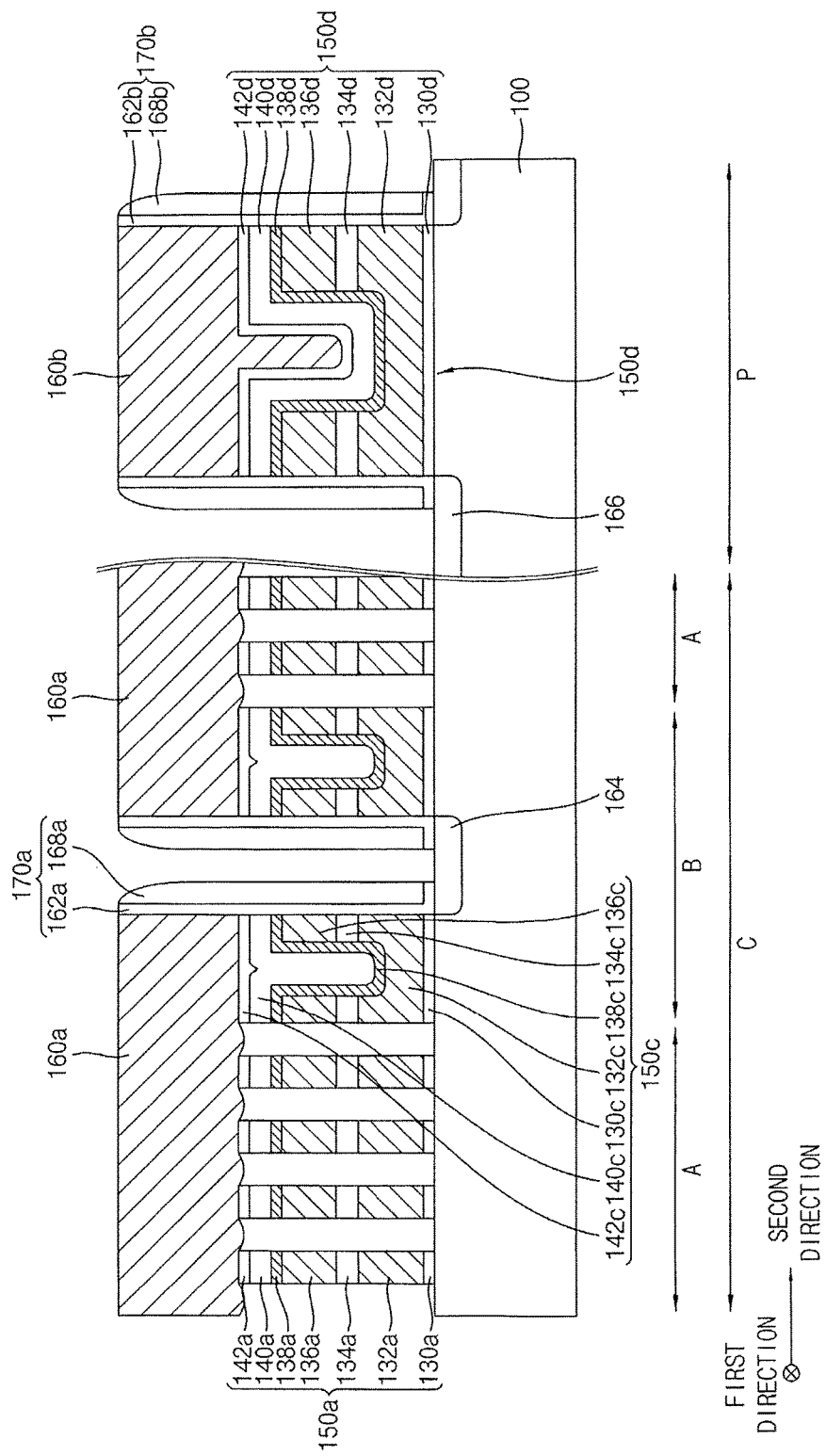

Referring to FIG. 14, the first and second spacer layers 162 and 168 may be anisotropically etched to form a first spacer structure 170a and a second spacer structure 170b, respectively. The first spacer structure 170a may be formed on the sidewalls of the second gate structure 150c and the first capping insulation pattern 160a exposed by the first opening 176. The second spacer structure 170b may be formed on the sidewalls of the third gate structure 150d and the second capping insulation pattern 160b.

The first spacer structure 170a may include a first spacer 162a and a second spacer 168a. The first spacer 162a may include a bent, or angled, portion between the second gate structure 150c and the upper surface of the substrate 100, so that the first spacer 162a may have an 'L' shape. The second spacer 168a may contact the first spacer 162a. The first spacer structure 170a may define the upper surface of the substrate 100 exposed by the first opening 176. As a result, in example embodiments the contact region may be defined by the first spacer structure 170a.

As shown in FIG. 14, the first spacer structure 170a may not be formed on the first sidewall of the second gate structure 150c, and may be formed on the second sidewall of the second gate structure 150c.

The second spacer structure 170b may include a third spacer 162b and a fourth spacer 168b. The third spacer 162b may be formed on the sidewalls of the second capping insulation pattern 160b and the third gate structure 150d, and the upper surface of the substrate 100 adjacent to the third gate structure 150d. Thus, the third spacer 162b may include a bent portion between the third gate structure 150d and the upper surface of the substrate 100, so that the third spacer 162b may have an 'L' shape. The fourth spacer 168b may contact the third spacer 162b.

An impurity region of the peripheral circuit transistor may be defined by the second spacer structure 170b.

Figure 15:
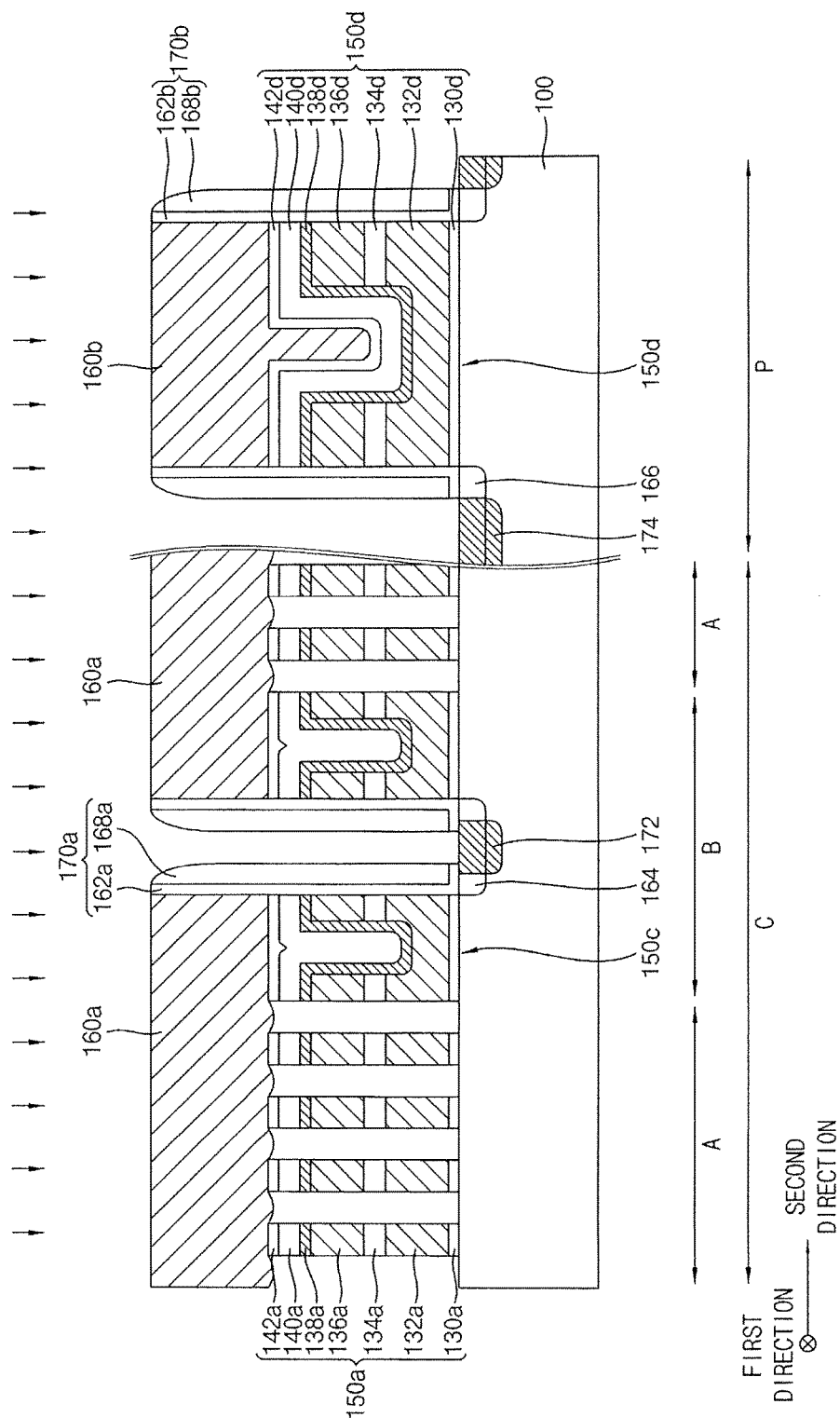

Referring to FIG. 15, an ion implantation process may be performed on the substrate 100 exposed by the first and second spacer structures 170a and 170b. As a result, a second impurity region 172 may be formed at an upper portion of the substrate 100 between the first spacer structures 170a, and a fourth impurity region 174 may be formed at an upper portion of the substrate 100 between the second spacer structures 170b. In example embodiments, the second impurity region 172 may serve as an impurity region of the selection transistor, and a fourth impurity region 174 may serve as an impurity region of the peripheral circuit transistor.

Figure 16:
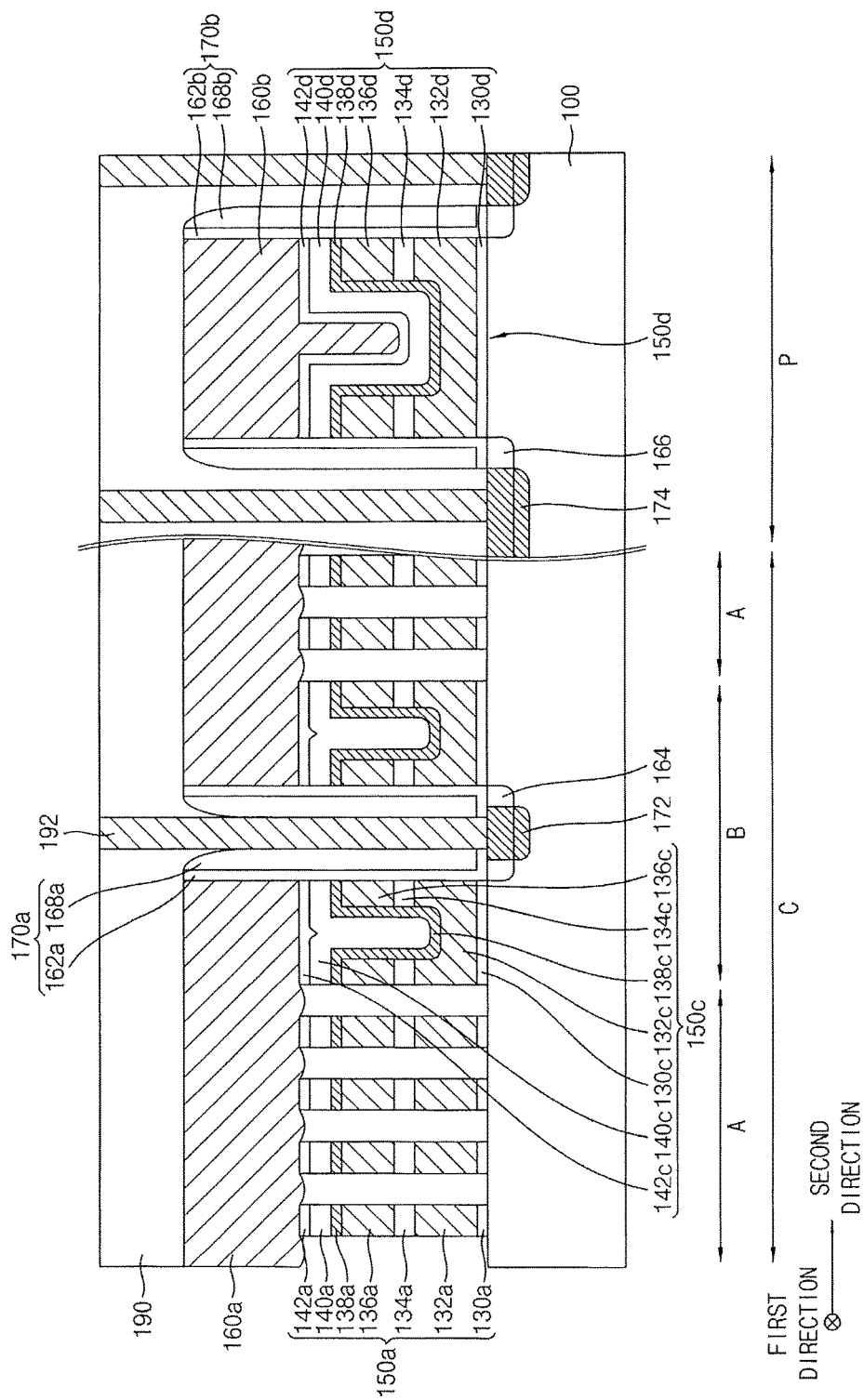

Referring to FIG. 16, an insulating interlayer 190 may be formed on the substrate and the first and second capping insulation patterns 160a and 160b to fill a gap between the first spacer structures 170a. A contact plug 192 may be formed through the insulating interlayer 190 to contact each of the second and fourth impurity regions 172 and 174.

As described above, the first gate structure 150a having the first width and the second and third gate structures 150c and 150d having widths greater than the first width may be formed by different patterning processes. As a result, in accordance with principles of inventive concepts, failures of the first, second and third gate structures 150a, 150c and 150d may decrease. Each of the first and second spacer structures 170a and 170b may include two spacers. The first spacer structures 170a may be formed on the second sidewall of the second gate structure 150c, and the second spacer structure 170b may be formed on the sidewalls of the third gate structures 150d. Thus, in accordance with principles of inventive concepts, failures due to the exposure of the second and third gate structures 150c and 150d may decrease. In accordance with principles of inventive concepts, a spacer structure formed on a sidewall of the second gate structure and sidewalls of the third gate structure may protect the second and third gate structures during an ion implantation process, for example.

Figure 17:
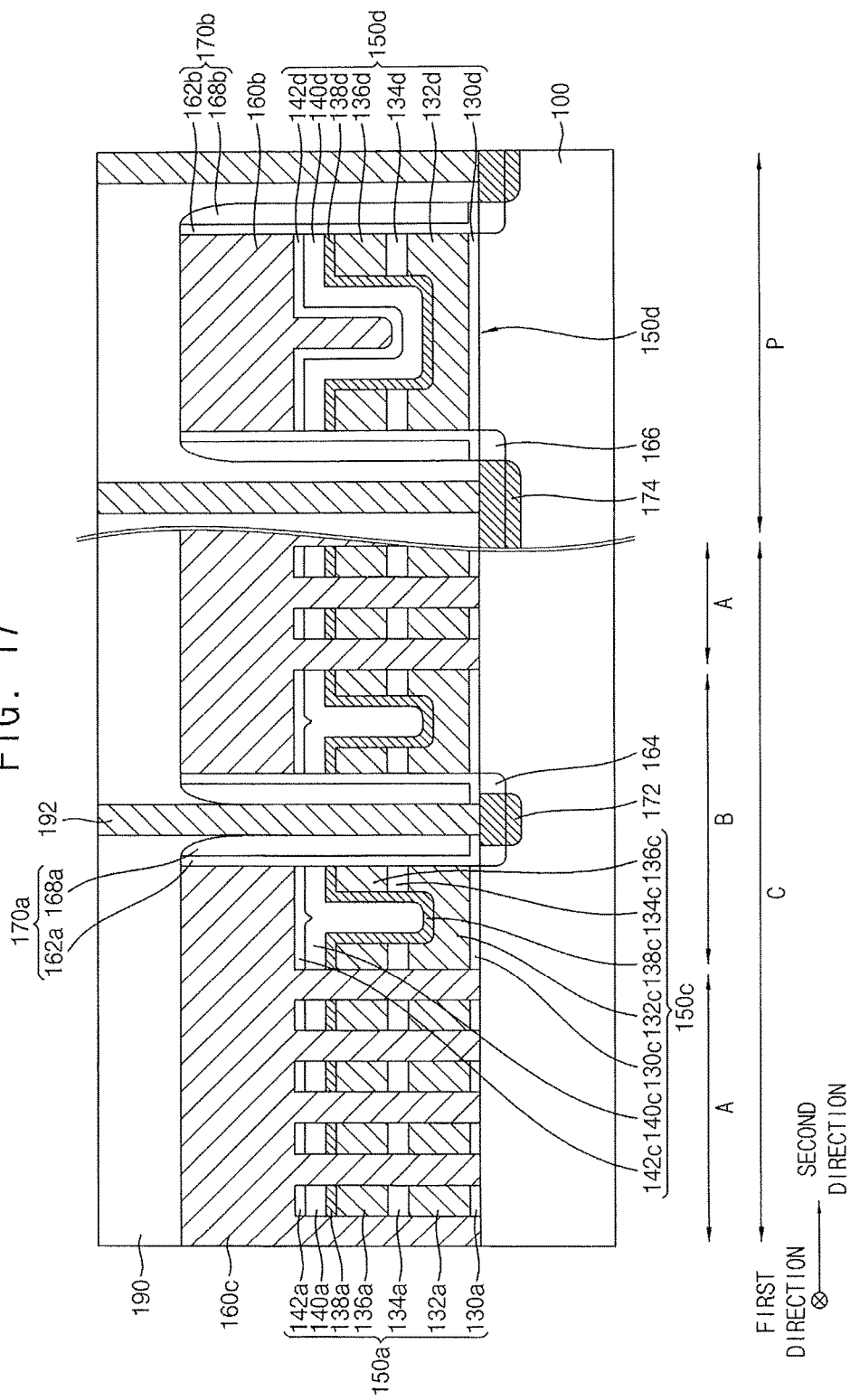

FIG. 17 is a cross-sectional view illustrating an example embodiment of a non-volatile memory device in accordance with principles of inventive concepts.

The non-volatile memory device shown in FIG. 17 may be substantially the same as the non-volatile memory device shown in FIGS. 1 and 2, except for a first capping insulation pattern.

Referring to FIG. 17, a first capping insulation pattern 160c may be formed on the first and the second gate structures 150a and 150c to fill a gap between the first gate structures 150a. As a result, an air gap may not be formed between the first gate structures 150a.

The non-volatile memory device of this example embodiment may be manufactured by processes substantially the same as processes illustrated with reference to FIGS. 3 to 16, with the exception that, in the process illustrated with reference to FIG. 9, the capping insulation layer may be formed to fill a gap between the first gate structures 150a.

Figure 18:
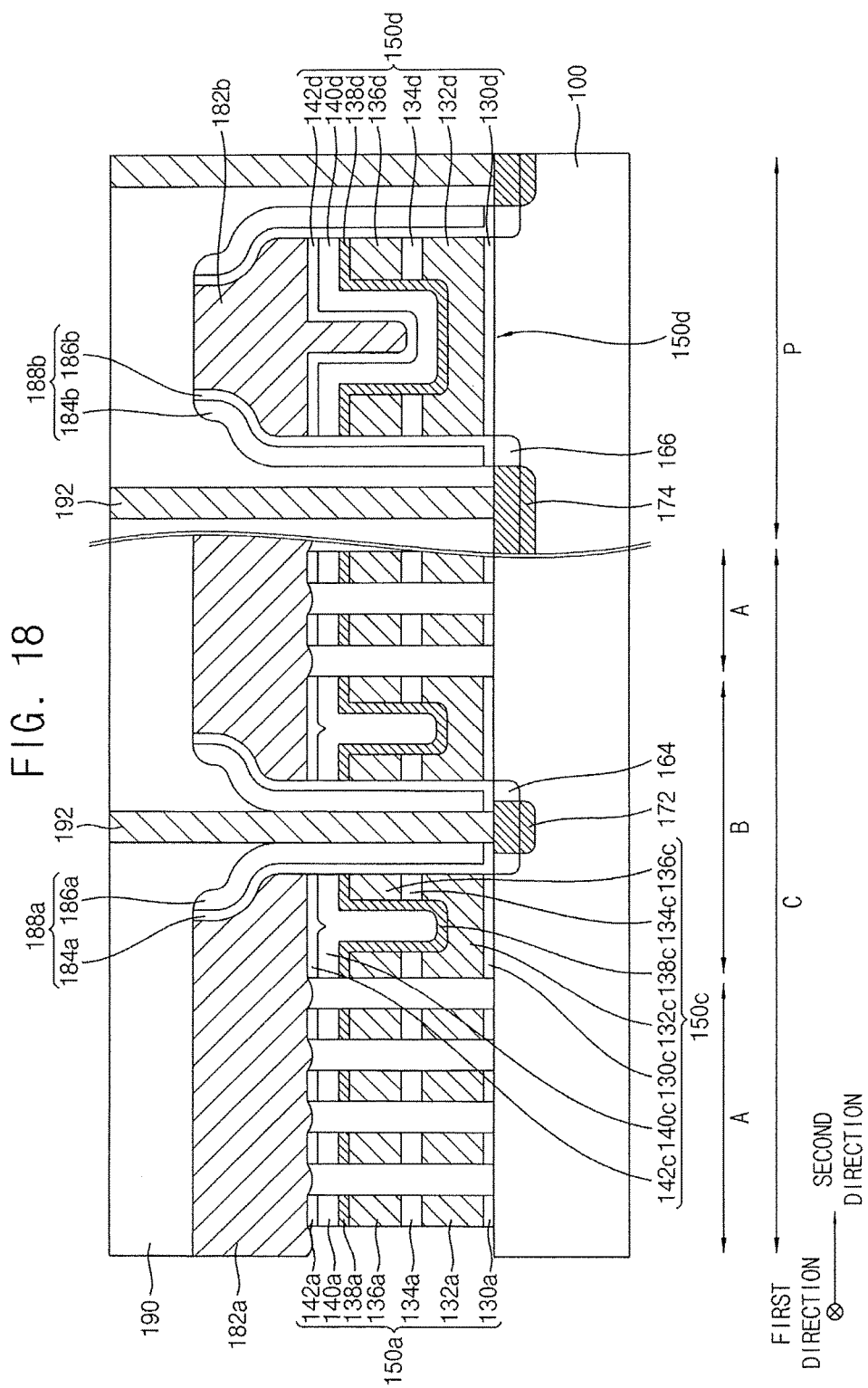

FIG. 18 is a cross-sectional view illustrating a non-volatile memory device in accordance with example embodiments.

The non-volatile memory device shown in FIG. 18 may be substantially the same as the non-volatile memory device shown in FIGS. 1 and 2, except for a capping insulation pattern and a spacer structure.

Referring to FIG. 18, the first gate structure 150a, the second gate structure 150c and the third gate structure 150d may be formed on the substrate 100. The first, second and third gate structures 150a, 150c and 150d may be substantially the same as the first, second and third gate structures 150a, 150c and 150d illustrated with reference to FIGS. 1 and 2.

A third capping insulation pattern 182a may be formed on the first and second gate structures 150a and 150c and a fourth capping insulation pattern 182b may be formed on the third gate structure 150d.

In example embodiments, the third capping insulation pattern 182a may not fill a space between the first gate structures 150a, and may cover an upper portion of the space between the first gate structures 150a. In this manner, an air gap may be formed between the first gate structures 150a.

Alternatively, the third capping insulation pattern 182a may be formed to fill the space between the first gate structures 150a and, in this case, an air gap may not be formed between the first gate structures 150a.

The third capping insulation pattern 182a may be formed on the first and second gate structures 150a and 150c in each of the cell strings. However, the third capping insulation pattern 182a may not be formed between the cell strings. As a result, a first opening may be formed between neighboring ones of the second gate structures 150c. The substrate 100, the second sidewall of the second gate structure 150c and a sidewall of the third capping insulation pattern 182a may be exposed by the first opening.

In the first opening, a portion from the upper surface of the substrate 100 to the second sidewall of the second gate structure 150c is referred to as a first portion, and a portion on the first portion exposing the sidewall of the third capping insulation pattern 182a is referred to as a second portion. In example embodiments, the first portion of the first opening may have a fourth width. A lower portion of the second portion of the first opening may have the fourth width, and an upper portion of the second portion of the first opening may have a fifth width greater than the fourth width.

Thus, in example embodiments, an upper width of the first opening may be greater than a lower width of the first opening. The insulating interlayer 190 may sufficiently fill the first opening so that the insulating interlayer 190 may have no void therein, and failures due to the void may decrease.

The sidewall of the third capping insulation pattern 182a exposed by the first opening may have an inflection point, creating a curve in the pattern. In example embodiments, the sidewall of the third capping pattern 182a exposed by the first opening may have a stepped, or curved, shape.

A lower portion of the fourth capping insulation pattern 182b may have a sixth width in the second direction, and an upper portion of the fourth capping insulation pattern 182b may have a seven width in the second direction less than the six width. In example embodiments, the six width may be substantially the same as a width in the second direction of the third gate structure 150d.

That is, each of sidewalls of the fourth capping insulation pattern 182b may have an inflection point. In example embodiments, each of the sidewalls of the fourth capping insulation pattern 182b may have a stepped shape.

A first spacer structure 188a may be formed on the sidewall of the first opening. The first spacer structure 188a may have first and second spacers 184a and 186a. The first spacer structure 188a may be formed on the second sidewall of the second gate structure 150c and the sidewalls of the third capping insulation pattern 182a. Thus, an upper portion of the first spacer structure 188a may have a vertical profile substantially the same as a vertical profile of the third capping insulation pattern 182a.

The first spacer 184a may include a bent, or angled, portion between the second gate structure 150c and the upper surface of the substrate 100, so that the first spacer 184a may have an 'L' shape. The third spacer 184b may include a bent portion between the third gate structure 150d and the upper surface of the substrate 100, so that the third spacer 184b may have an 'L' shape.

A first impurity region 164 may be formed at an upper portion of the substrate 100 between neighboring ones of the second gate structures 150c, and a third impurity region 166 may be formed at an upper portion of the substrate 100 adjacent to the third spacer structure 150d. A second impurity region 172 may be formed at an upper portion of the substrate 100 between the first spacer structures 170a, and a fourth impurity region may be formed at an upper portion of the substrate 100 adjacent to the second spacer structure 170b.

An insulating interlayer 190 may be formed on the substrate 100 and the third and fourth capping patterns 182a and 182b. The insulating interlayer 190 may have no void therein. A contact plug 192 may be formed through the insulating interlayer 190, and contact the second and fourth impurity regions 172 and 174.

FIGS. 19 to 24 are cross-sectional views illustrating stages of an example method of manufacturing a non-volatile memory device in accordance with principles of inventive concepts.

Figure 19:
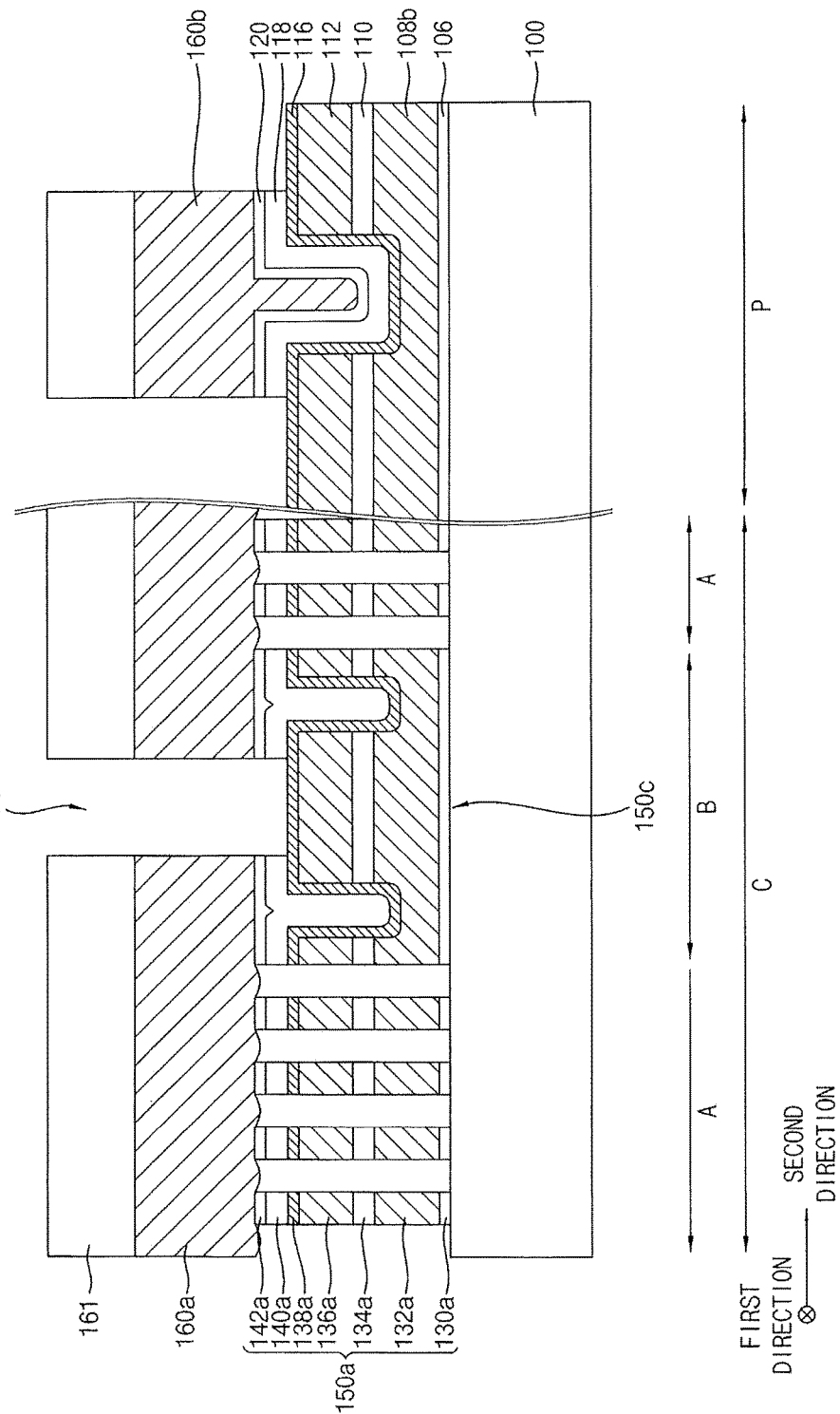

Referring to FIG. 19, processes illustrated with reference to FIGS. 3 to 9 may be performed.

The preliminary second gate structure 150b and layers on the peripheral circuit region P may be partially and anisotropically etched using the etching mask. When the etching process is performed, at least the capping insulation layer 160 (refer to FIG. 9) may be etched. Thus, a first capping insulation pattern 160a and a second capping insulation pattern 160b may be formed.

Additionally, a preliminary opening 175 may be formed between the first capping insulation patterns 160a.

In example embodiments, a capping insulation layer 160, the second mask layer 120 and the first mask layer 118 may be sequentially etched using the etching mask 161. In this case, in the etching process, the third conductive layer 116 may be exposed by the preliminary opening 175.

Alternatively, the capping insulation layer 160, the second mask layer 120, the first mask layer 161, the third conductive layer 116 and the second conductive layer 112 may be sequentially etched using the etching mask 161. In this case, in the etching process, the dielectric structure 110 may be exposed by the preliminary opening 175.

Alternatively, the capping insulation layer 160 may only be etched using the etching mask 161. In this case, in the etching process, the second mask layer 120 may be exposed by the preliminary opening 175.

Hereinafter, an example embodiment in which the third conductive layer 116 is exposed in the etching process may be described.

Figure 20:
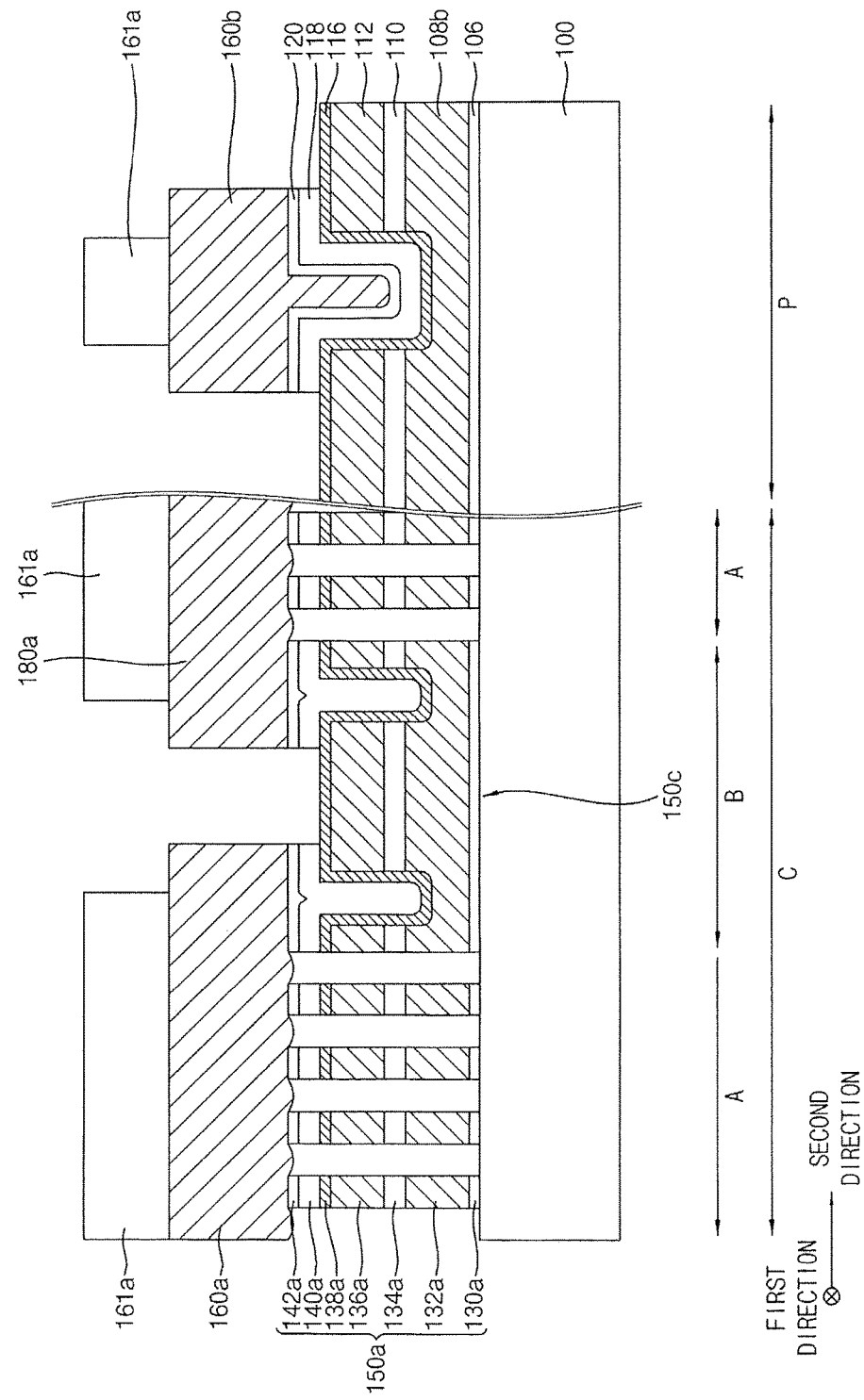

Referring to FIG. 20, the etching mask 161 may be partially and isotropically etched to form a first etching mask 161a.

The isotropic etching process may include an isotropic dry etching process or a wet etching process, for example. Upper surfaces of the first and second capping insulation patterns 160a and 160b may be exposed by the first etching mask 161a.

Figure 21:
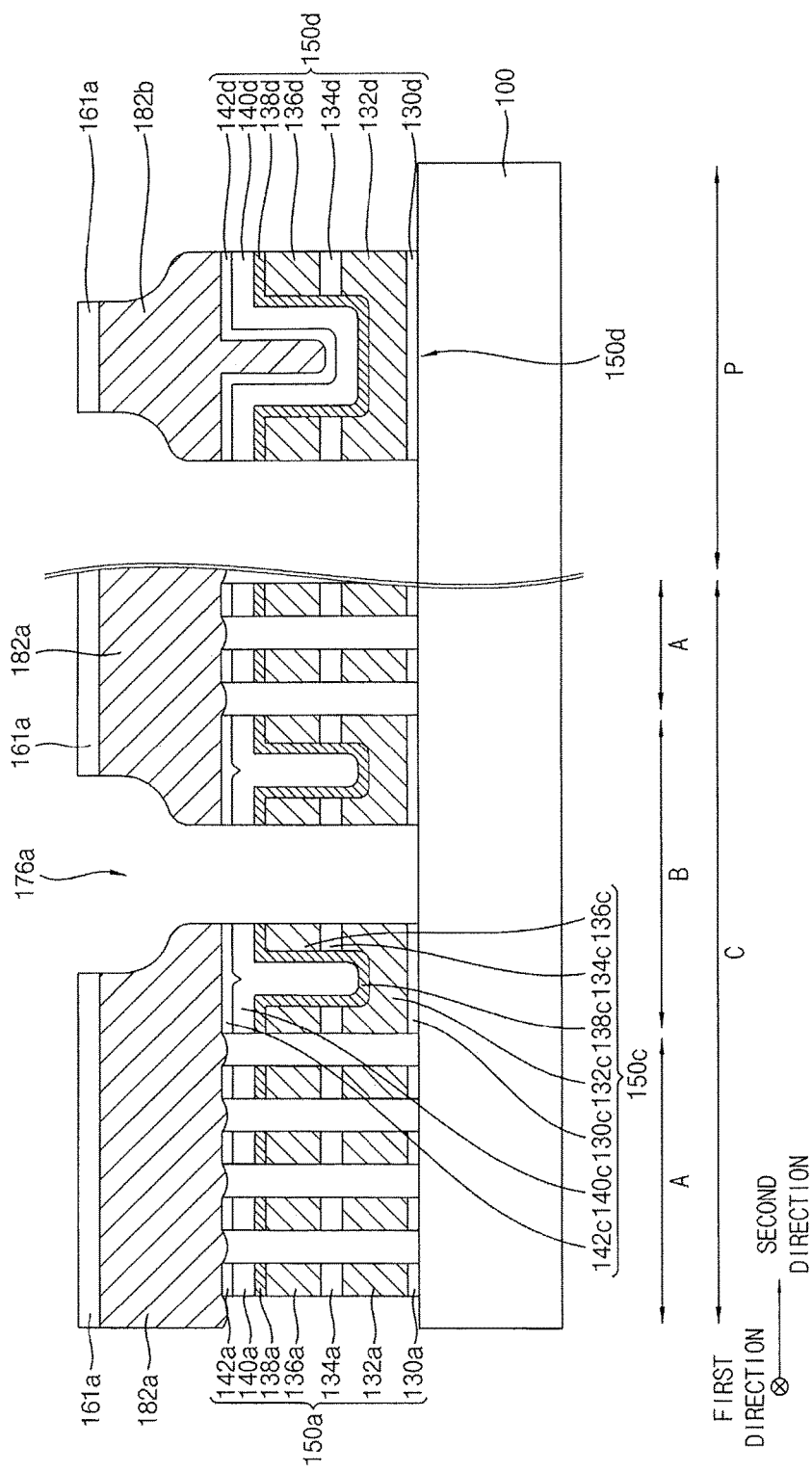

Referring to FIG. 21, the preliminary second gate structure 150b and the layers on the peripheral circuit region P may be anisotropically etched using the first etching mask 161a and the first and second capping insulation patterns 160a and 160b as an etching mask until the upper surface of the substrate 100 may be exposed.

In example embodiments, the third conductive layer, the second conductive layer, the dielectric structure, the first conductive layer and the gate insulation layer between the first capping insulation patterns 160a may be sequentially etched to form a second gate structure 150c on the selection transistor region.

During the etching process, the first capping insulation pattern 160a may be partially etched to form a third capping insulation pattern 182a. As a result, a sidewall of the third capping insulation pattern 182a may have an inflection point. For example, the sidewall of the third capping insulation pattern 182a may have a stepped shape.

After the etching process, the first opening 176a may be formed between the second gate structures 150c. The sidewalls of the second gate structure 150c and the third capping insulation pattern 182a may be exposed by the first opening 176a. An upper width of the first opening 176a may be greater than a lower width of the first opening 176a.

In example embodiments, the third conductive layer, the second conductive layer, the dielectric structure and the first gate insulation layer exposed by the second capping insulation pattern 160b may be sequentially etched to form a third gate structure 150d on the peripheral circuit region P.

During the etching process, the second capping insulation pattern 160b may be partially etched to form a fourth capping insulation pattern 182b. As a result, an upper width of the fourth capping insulation pattern 182b may be less than a lower width of the fourth capping insulation pattern 182b and each of the sidewalls of the fourth capping insulation pattern 182b may have an inflection point. For example, each of the sidewalls of the fourth capping insulation pattern 182b may have a stepped shape.

During the etching process, the first etching mask 161a may be partially etched. After forming the second and third gate structures 150c and 150d, the first etching mask may be removed.

Figure 22:
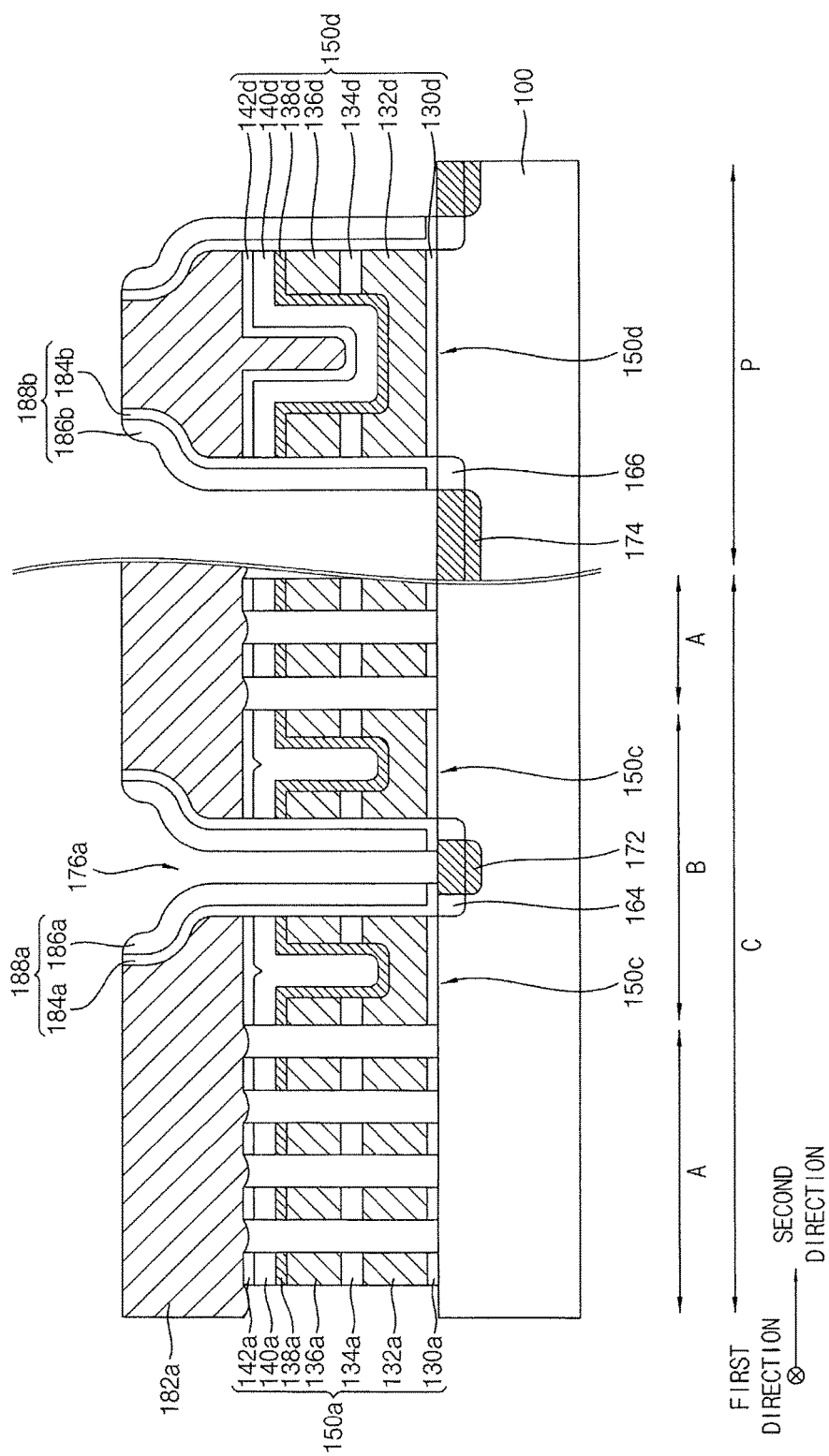

Referring to FIG. 22, processes illustrated with reference to FIGS. 11 to 15 may be performed.

Thus, the first impurity region 164 may be formed at an upper portion of the substrate 100 between the second gate structures 150c, and the third impurity region 166 may be formed at an upper portion of the substrate 100 adjacent to the third gate structure 150d.

A first spacer structure 188a may be formed on the sidewalls of the second gate structure 150c and the third capping insulation pattern 182a exposed by the first opening 176a. A second spacer structure 188b may be formed on the sidewalls of the third gate structure 150d and the fourth capping insulation pattern 182b.

A second impurity region 172 may be formed at an upper portion of the substrate 100 between the first spacer structures 188a, and a fourth impurity region 174 may be formed at an upper portion of the substrate 100 adjacent to the second spacer structure 188b.

Figure 23:
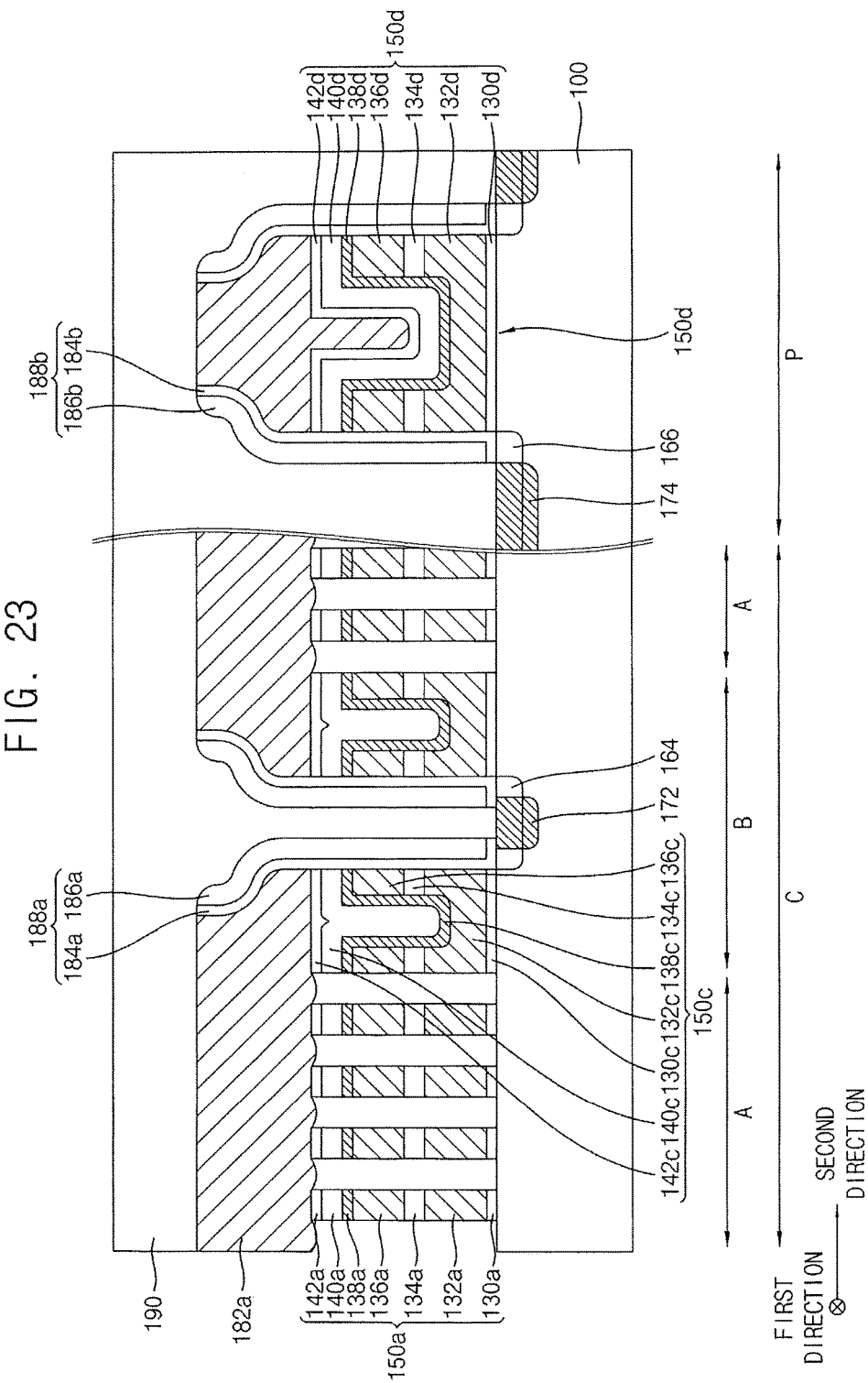

Referring to FIG. 23, an insulating interlayer 190 may be formed on the substrate 100, the third and fourth capping insulation patterns 182a and 182b to fill a space between the first spacer structures 188a.

When the upper width of the first opening 176a increases, an upper width of a space between the second spacer structures 170b may also increase. As a result, in accordance with principles of inventive concepts, the insulating interlayer 190 may easily fill the space between the second spacer structures 188b, and the insulation interlayer 190 may have no void therein.

Figure 24:
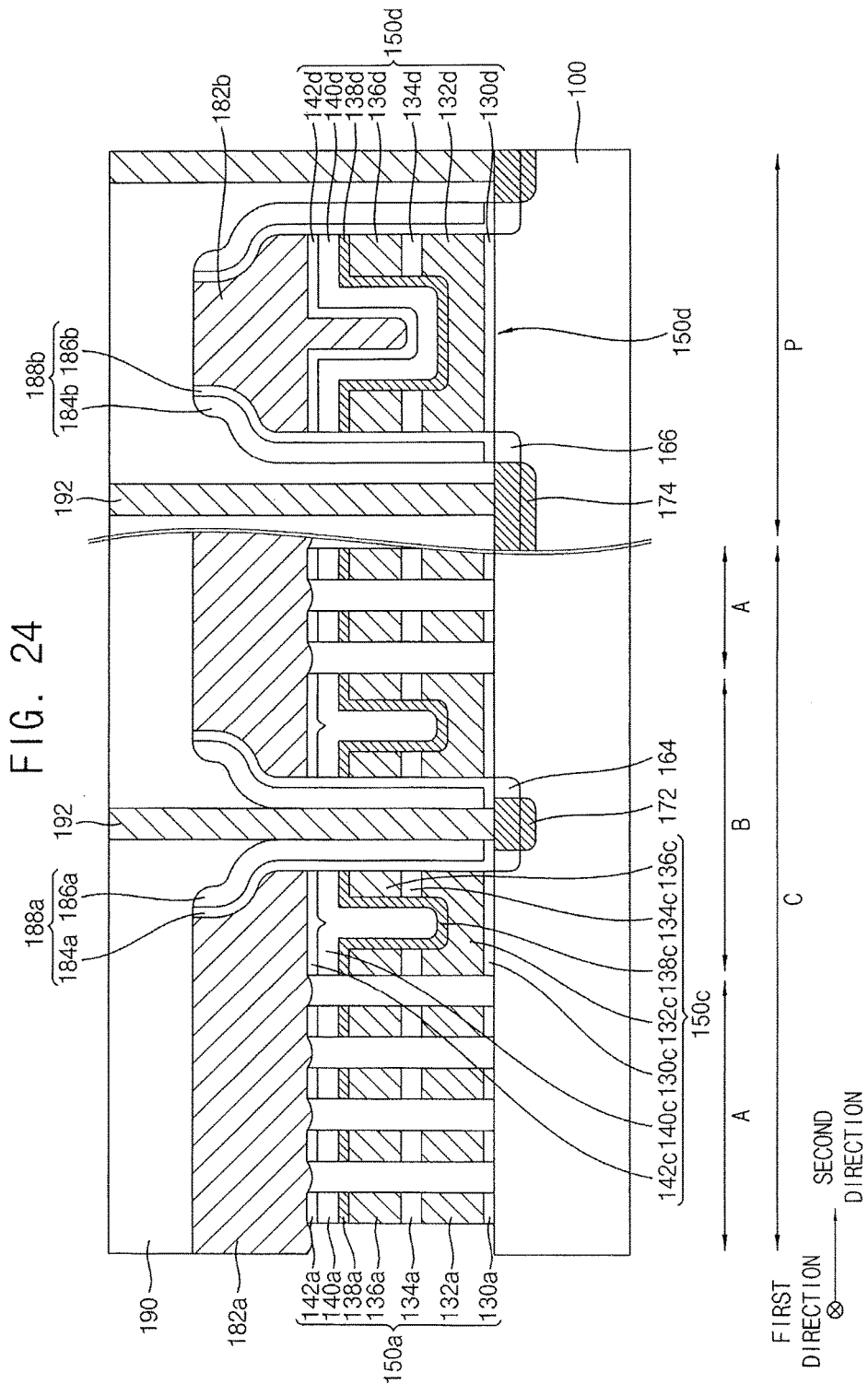

Referring to FIG. 24, the insulating interlayer 190 may be partially etched to form a contact hole exposing each of the second and fourth source regions 172 and 174. A conductive material may fill the contact hole, so that a contact plug 192 may be formed on each of the second and fourth source regions 172 and 174.

If the insulating interlayer 190 were to have a void therein, a portion of the insulating interlayer 190 adjacent the void may be over-etched during formation of the contact hole. However, because, in accordance with principles of inventive concepts, the insulating interlayer 190 may have no void therein, failures of the contact plug 192 due to the over-etching may be diminished. That is, in accordance with principles of inventive concepts, capping patterns formed on second and third gate structures have inflection points, or curves, on sidewalls that allow for a greater upper width between spacer structures, thereby allowing the interlayer insulation pattern to readily fill the gap therebetween, eliminating voids an preventing over-etching.

Figure 25:
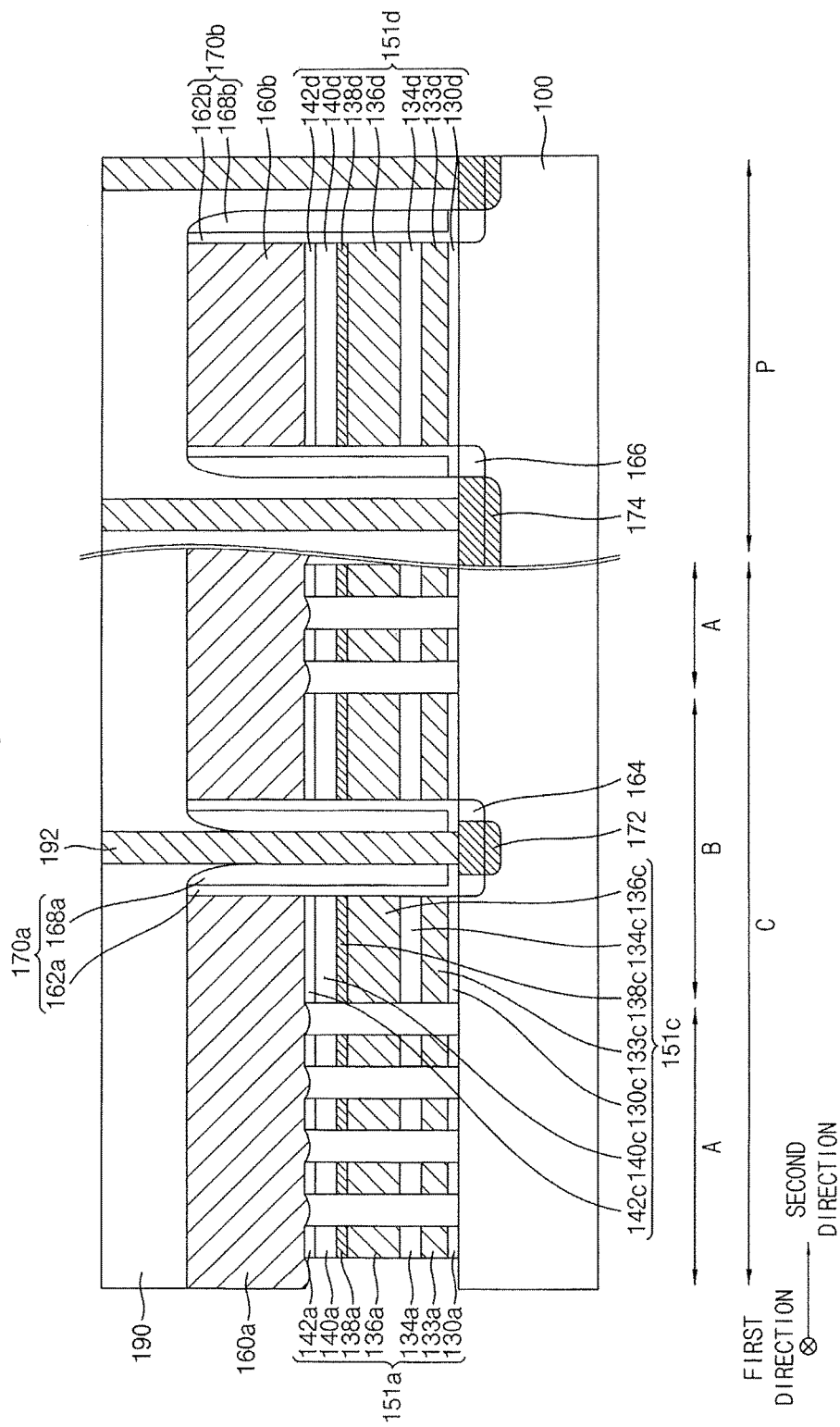

FIG. 25 is a cross-sectional view illustrating an example embodiment of a non-volatile memory device in accordance with principles of inventive concepts.

The non-volatile memory device shown in FIG. 25 may be substantially the same as the non-volatile memory device shown in FIGS. 1 and 2, except for a first gate structure, a second gate structure and a third gate structure.

Referring to FIG. 25, first, second and third gate structures 151a, 151c and 151d may include gate insulation layers 130a, 130c and 130d, charge trapping patterns 133a, 133c and 133d, dielectric patterns 134a, 134c and 134d, second conductive patterns 136a, 136c and 136d, third conductive patterns 138a, 138c and 138d, first masks 140a, 140c and 140d, and second masks 142a, 142c and 142d, respectively. Each of the second and third gate structures 151c and 151d may have no recess.

In example embodiments, the charge trapping patterns 133a, 133c and 133d may include silicon nitride.

The non-volatile memory device may be manufactured by processes substantially the same as processes illustrated with reference to FIGS. 3 to 16, with the exception that, in the process illustrated with reference to FIG. 3, a charge trap layer including silicon nitride may be formed on the preliminary gate insulation layer. Additionally, in the process illustrated with reference to FIG. 6, the first and second recesses may not be formed in the second and third gate structures.

Figure 26:
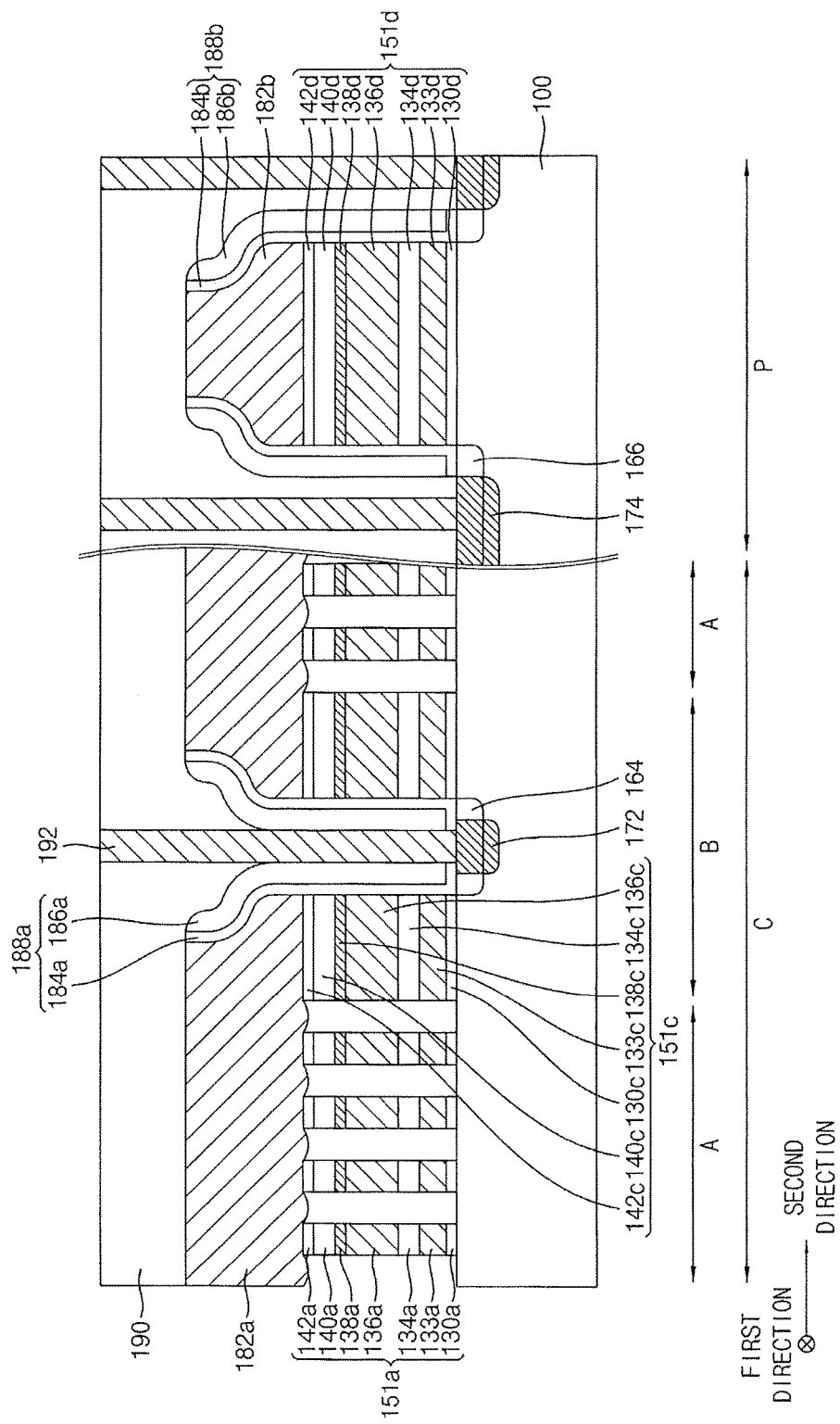

FIG. 26 is a cross-sectional view illustrating an example embodiment of a non-volatile memory device in accordance with principles of inventive concepts.

The non-volatile memory device shown in FIG. 26 may be substantially the same as the non-volatile memory device shown in FIG. 25, except for a capping insulation pattern.

Referring to FIG. 26, a third capping insulation pattern 182a may be formed on the first and second gate structures 151a and 151c. The third capping insulation pattern 182a may be substantially the same as the third capping insulation pattern illustrated with reference to FIG. 18. Thus, in accordance with principles of inventive concepts, an upper width of the first opening between the second gate structures 151c may be greater than a lower width of the first opening and a sidewall of the third capping insulation pattern 182a may have an inflection point. That is, in accordance with principles of inventive concepts, the sidewall of the third capping insulation pattern 182a may have a stepped shape, or curved shape, with a wider opening between sidewalls at the top.

A fourth capping insulation pattern 182b may be formed on the third gate structure 151d. The fourth capping insulation pattern 182b may be substantially the same as the fourth capping insulation pattern illustrated with reference to FIG. 18. Thus, an upper width of the fourth capping insulation pattern 182b may be less than a lower width of the fourth capping insulation pattern 182b and, as a result, a sidewall of the fourth capping insulation pattern 182b may have an inflection point. That is, the sidewall of the fourth capping insulation pattern 182b may have a stepped shape.

As described above, a semiconductor device including gate structures having various critical dimensions may be formed.

The foregoing is illustrative of example embodiments and is not to be construed as limiting thereof. Although example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   first gate structures on a substrate, each of the first gate structures having a first width;
   second gate structures on the substrate, each of the second gate structures having a second width greater than the first width;
   first capping insulation patterns covering upper portions of the first and second gate structures, a first opening being between neighboring ones of the second gate structures;
   first spacer structures on sidewalls of each of the second gate structures and each of the first capping insulation patterns that are exposed by the first opening, each of the first spacer structures including a first spacer and a second spacer; and
   a first impurity region at an upper portion of the substrate between the first spacer structures.

2. The semiconductor device of claim 1, wherein the first spacer includes a material different from a material of the second spacer.

3. The semiconductor device of claim 1, wherein the first spacer is on the sidewalls of each of the second gate structures and each of the first capping insulation patterns and an upper surface of the substrate, the first spacer including a curved portion between the second gate structure and the upper surface of the substrate.

4. The semiconductor device of claim 3, wherein the second spacer is on the first spacer.

5. The semiconductor device of claim 1, wherein the first capping insulation patterns do not fill a space between the first gate structures, so that an air gap is defined by the space between the first gate structures.

6. The semiconductor device of claim 1, wherein each of the first and second gate structures includes a gate insulation layer, a first conductive pattern, a dielectric pattern, a second conductive pattern and a third conductive pattern sequentially stacked.

7. The semiconductor device of claim 6, wherein the first, second and third conductive patterns in each of the second gate structures are electrically connected to each other.

8. The semiconductor device of claim 6, wherein the third conductive patterns in the first and second gate structures include a metal or a metal nitride.

9. The semiconductor device of claim 1, wherein each of the first and second gate structures includes a gate insulation layer, a charge trapping pattern, a dielectric pattern and a conductive pattern sequentially stacked.

10. The semiconductor device of claim 1, wherein an upper width of the first opening is greater than a lower width of the first opening, and a sidewall of each of the first capping insulation patterns has an inflection point.

11. The semiconductor device of claim 1, further comprising:
    a third gate structure on the substrate, the third gate structure having a third width greater than the second width;
    a second capping insulation pattern on the third gate structure; and
    a second spacer structure on sidewalls of the third gate structure and the second capping insulation pattern, the second spacer structure including a third spacer and a fourth spacer.

12. The semiconductor device of claim 11, further comprising a second impurity region at an upper portion of the substrate adjacent to a sidewall of the second spacer structure.

13. The semiconductor device of claim 11, wherein the third gate structure includes a gate insulation layer, a first conductive pattern, a dielectric pattern, a second conductive pattern and a third conductive pattern sequentially stacked, and the first, second and third conductive patterns in the third gate structure are electrically connected to each other.

14. The semiconductor device of claim 11, wherein an upper width of the second capping insulation pattern is less than a lower width of the second capping insulation pattern, and each of opposite sidewalls of the second capping insulation pattern has an inflection point.

15. A semiconductor device, comprising:
    first gate structures on a first region of a substrate, each of the first gate structures having a first width;
    second gate structures including sidewalls on the first region of the substrate, each of the second gate structures having a second width greater than the first width, wherein sidewalls of neighboring ones of the second gate structures oppose to each other;
    a third gate structure on a second region of the substrate, the third gate structure having a third width greater than the second width;

first capping insulation patterns covering upper portions of the first and second gate structures, a first opening being between neighboring ones of the second gate structures;

a second capping insulation pattern on the third gate structure;

a first spacer structure on sidewalls of each of the second gate structures and each of the first capping insulation patterns exposed by the first opening, the first spacer structure including a first spacer and a second spacer; and a second spacer structure on sidewalls of the third gate structure and the second capping insulation pattern, the second spacer structure including a third spacer and a fourth spacer.

16. The semiconductor device of claim 15, wherein the first spacer includes a material different from a material of the second spacer, and the third spacer includes a material different from a material of the fourth spacer.

17. The semiconductor device of claim 15, wherein the first spacer includes a material substantially the same as a material of the third spacer, and the second spacer includes a material different from a material of the fourth spacer.

18. The semiconductor device of claim 15, wherein the first spacer includes a first curved portion between the second gate structure and an upper surface of the substrate, and the third spacer includes a second curved portion between the third gate structure and the upper surface of the substrate.

* * * * *